US012800671B2

(12) United States Patent
Tanaka

(10) Patent No.: US 12,800,671 B2
(45) Date of Patent: Nov. 17, 2026

(54) STATE ESTIMATION METHOD, STATE ESTIMATION DEVICE, AND RECORDING MEDIUM RECORDING PROGRAM

(71) Applicant: TOYOTA JIDOSHA KABUSHIKI KAISHA, Toyota (JP)

(72) Inventor: Takumi Tanaka, Takarazuka (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 514 days.

(21) Appl. No.: 18/243,868

(22) Filed: Sep. 8, 2023

(65) Prior Publication Data

US 2024/0110994 A1 Apr. 4, 2024

(30) Foreign Application Priority Data

Sep. 30, 2022 (JP) ................................ 2022-158511

(51) Int. Cl.
*G01R 31/392* (2019.01)
*G01R 31/36* (2020.01)
(Continued)

(52) U.S. Cl.
CPC ....... *G01R 31/392* (2019.01); *G01R 31/3648* (2013.01); *G01R 31/367* (2019.01); *G01R 31/389* (2019.01)

(58) Field of Classification Search
CPC ......................... G01R 31/392; G01R 31/3648; G01R 31/367; G01R 31/389; G01R 31/382;
(Continued)

(56) References Cited

U.S. PATENT DOCUMENTS 11,691,518 B2 * 7/2023 Holme .................... B60L 58/16 701/22
2012/0316815 A1 12/2012 Morigaki
(Continued)

FOREIGN PATENT DOCUMENTS

EP 3 229 298 B1 12/2018
JP H10-082843 A 3/1998
(Continued)

*Primary Examiner* — Manuel A Rivera Vargas
(74) *Attorney, Agent, or Firm* — Oliff PLC

(57) ABSTRACT

A state estimation device includes a first acquisition section, a derivation section, a second acquisition section, a computation section and an estimation section. The first acquisition section acquires measurement data and states of a reference rechargeable battery before and after a test that causes deterioration to progress. The measurement data is impedances at respective frequencies measured by an impedance method, and the states are found in advance. The derivation section computes peak frequencies before and after the test from arc-shaped curves in graphs plotting the impedances at the respective frequencies represented by the measurement data, and obtains a model representing a relationship between peak frequencies and states. The second acquisition section acquires measurement data of an estimation target rechargeable battery, which is impedances at respective frequencies measured by the impedance method. The computation section computes a peak frequency from an arc-shaped curve in a graph plotting the impedances at the respective frequencies represented by this measurement data. The estimation section uses the model to estimate the state of the estimation target rechargeable battery from the peak frequency of the estimation target rechargeable battery.

13 Claims, 19 Drawing Sheets

(51) Int. Cl.
*G01R 31/367* (2019.01)
*G01R 31/389* (2019.01)

(58) Field of Classification Search
CPC ....... G01R 23/16; G01R 31/396; Y02E 60/10; H01M 8/10; H01M 10/0525; H01M 10/48
See application file for complete search history.

(56) References Cited

U.S. PATENT DOCUMENTS

| | | | | |
|---|---|---|---|---|
| 2015/0301118 | A1 | 10/2015 | Tao et al. | |
| 2016/0195588 | A1 | 7/2016 | Ikeda et al. | |
| 2017/0123013 | A1 | 5/2017 | Tao et al. | |
| 2017/0315179 | A1* | 11/2017 | Baba | G01R 31/367 |
| 2018/0188329 | A1* | 7/2018 | Huang | G01R 31/3648 |
| 2019/0023131 | A1* | 1/2019 | Katayama | B60L 58/16 |
| 2019/0170831 | A1* | 6/2019 | Sada | G01R 31/389 |
| 2020/0106137 | A1* | 4/2020 | Murphy | H01M 10/0525 |
| 2020/0393518 | A1 | 12/2020 | Takegami et al. | |
| 2021/0278472 | A1 | 9/2021 | Sakai et al. | |
| 2023/0160965 | A1* | 5/2023 | Kim | G01R 31/3835 702/63 |
| 2024/0077546 | A1* | 3/2024 | Cantadori | H02J 7/005 |

FOREIGN PATENT DOCUMENTS

| | | | |
|---|---|---|---|
| JP | 2013-250223 | A | 12/2013 |
| JP | 2013-253991 | A | 12/2013 |
| JP | 2016-90346 | A | 5/2016 |
| JP | 2020-167069 | A | 10/2020 |
| JP | 2021-140991 | A | 9/2021 |
| JP | 2022-108675 | A | 7/2022 |
| WO | 2012/095913 | A1 | 7/2012 |
| WO | 2015/011872 | A1 | 1/2015 |
| WO | 2019/017991 | A1 | 1/2019 |

* cited by examiner

STATE ESTIMATION METHOD, STATE ESTIMATION DEVICE, AND RECORDING MEDIUM RECORDING PROGRAM

CROSS-REFERENCE TO RELATED APPLICATION

This application is based on and claims priority under 35 USC 119 from Japanese Patent Application No. 2022-158511 filed on Sep. 30, 2022, the disclosure of which is incorporated by reference herein.

BACKGROUND

Technical Field

The present disclosure relates to a state estimation method, a state estimation device, and a recording medium recording a program.

Background Art

In recent years, applications of rechargeable batteries in electric vehicles and the like have rapidly expanded. Reusing rechargeable batteries that have been used for vehicles as rechargeable batteries for fixed equipment and the like is increasingly important from the perspective of effective utilization of natural resources and the like. When a rechargeable battery is to be reused, its state of deterioration must be accurately determined in order to judge whether or not reuse is possible. Technologies have been disclosed that estimate states of deterioration of lithium-ion batteries (for example, Japanese Patent Application Laid-Open JP-A) Nos. 2021-140991 and 2020-167069, and International Publication No. WO2012/095913).

JP-A No. 2021-140991 discloses a method of analyzing a state of deterioration from changes in voltage after current is disconnected from an all-solid-state battery. JP-A No. 2020-167069 and WO2012/095913 disclose methods that use alternating current (AC) impedance methods to analyze states of deterioration.

In recent years, there have been expectations for all-solid-state batteries, which utilize solid-state electrolytes as their electrolytes, to be employed as high-performance rechargeable batteries in place of liquid-based lithium-ion batteries. Similarly to conventional liquid-based lithium-ion batteries, effective utilization through reuse of used all-solid-state batteries is important.

Deterioration due to charging and discharging of a rechargeable battery includes chemical deterioration, in which battery performance declines due to chemical side reactions of structural materials such as an active material, a solid-state electrolyte and the like, and physical deterioration, in which battery performance declines due to weakening contact between structural materials resulting from expansion and contraction of an active material and the like. Physical deteriorations such as cracks forming between an active material and a solid-state electrolyte and between one solid-state electrolyte and another solid-state electrolyte are important factors in the deterioration of all-solid-state batteries.

In the method recited in WO2012/095913, estimating a state of deterioration from a resistance value obtained by an AC impedance method is disclosed. In general, the higher a resistance value, the lower a battery capacity is estimated to be. However, a relationship between resistance values and battery capacities is not always clear. Particularly with an all-solid-state battery, it may not be possible to estimate a battery capacity accurately.

JP-A No. 2021-140991 discloses the method of using a change in voltage after current is disconnected to estimate a state of deterioration, and JP-A No. 2020-167079 discloses the method of using an estimation of resistance based on the AC impedance method to estimate a state of deterioration. These documents do not mention physical deterioration of an all-solid-state battery, and do not disclose a method that can conveniently distinguish and judge physical deterioration.

Thus, in JP-A Nos. 2021-140991 and 2020-167069 and WO2012/095913, no consideration is given to physical deteriorations that are particular to all-solid-state batteries, such as cracks forming between an active material and a solid-state electrolyte or between solid-state electrolytes, and so forth.

SUMMARY

An object of the present disclosure is to provide a state estimation method, a state estimation device and a program that may estimate a state of a rechargeable battery employing a solid-state electrolyte with consideration for physical deterioration.

A first aspect is a state estimation method for estimating a state of a rechargeable battery that uses a solid-state electrolyte, the state estimation method including: acquiring measurement data and states of a reference rechargeable battery before and after a test that causes deterioration to progress, the measurement data being impedances at respective frequencies that are measured by an impedance method, and the states being found in advance; computing peak frequencies before and after the test from arc-shaped curves in graphs plotting the impedances at the respective frequencies represented by the measurement data; based on the computed peak frequencies before and after the test and the states found in advance, obtaining a model that represents a relationship between the peak frequencies and the states; acquiring measurement data of an estimation target rechargeable battery, the measurement data being impedances at respective frequencies that are measured by the impedance method; computing a peak frequency from an arc-shaped curve in a graph plotting the impedances at the respective frequencies represented by the measurement data; and estimating a state of the estimation target rechargeable battery from the peak frequency of the estimation target rechargeable battery, the estimating including using the model.

In the state estimation method according to the first aspect, the measurement data and states found in advance of the reference rechargeable battery are acquired. The measurement data is impedances at respective frequencies, measured by the impedance method before and after the test that causes deterioration to progress. Examples of the "test that causes deterioration to progress" include a cycling test in which charging and discharging of the rechargeable battery is repeated under predetermined conditions, a test that holds the rechargeable battery at a constant state of charge, and so forth.

The peak frequencies before and after the test are computed from arc-shaped curves in the graphs plotting the impedances at the respective frequencies represented by the measurement data. The meaning of the term "graph" as used herein is intended to include a graph plotting the impedances for the respective frequencies with real components of the impedances on a horizontal axis and imaginary components of the impedances on a vertical axis. The meaning of the term "peak frequency" as used herein is intended to include a frequency that produces a peak on the arc-shaped curve of the graph, at which absolute values of the imaginary values are at a maximum.

On the basis of the computed peak frequencies and the states found in advance from before and after the test, a model representing the relationship between peak frequencies and states is obtained. Hence, for an estimation target rechargeable battery, measurement data is acquired, which is impedances at respective frequencies measured by the impedance method, and a peak frequency is computed from an arc-shaped curve in a graph plotting the impedances at the respective frequencies represented by this measurement data. Using the model, the state of the estimation target rechargeable battery is then estimated from the peak frequency of the estimation target rechargeable battery.

In this state estimation method, the model representing the relationship between peak frequencies and states is found on the basis of the peak frequencies computed for before and after the test that causes deterioration of the reference rechargeable battery to progress and the states that are found in advance. The peak frequency of the estimation target rechargeable battery is computed from the arc-shaped curve in the graph plotting the impedances at the respective frequencies represented by the measurement data acquired for the estimation target rechargeable battery. Because the model is used to estimate the state of the estimation target rechargeable battery from this peak frequency, the state of a rechargeable battery employing a solid-state electrolyte may be estimated with consideration for physical deterioration.

In a state estimation method according to a second aspect, in the state estimation method according to the first aspect, the states are capacities.

In the state estimation method according to the second aspect, a model representing a relationship between peak frequencies and capacities is found on the basis of the peak frequencies computed for before and after the test that causes deterioration of the reference rechargeable battery to progress and capacities that are found in advance. The peak frequency of the estimation target rechargeable battery is computed from the arc-shaped curve in the graph plotting the impedances at the respective frequencies represented by the measurement data acquired for the estimation target rechargeable battery. The model is used to estimate a capacity of the estimation target rechargeable battery from this peak frequency. Therefore, the capacity of a rechargeable battery employing a solid-state electrolyte may be estimated with consideration for physical deterioration.

In a state estimation method according to a third aspect, in the state estimation method according to the second aspect, the model is a relational expression $w=F(x)$ representing a relationship between peak frequencies $x$ and capacities $w$.

In the state estimation method according to the third aspect, the relational expression $w=F(x)$ representing the relationship between peak frequencies $x$ and capacities $w$ is found on the basis of the peak frequencies computed for before and after the test that causes deterioration of the reference rechargeable battery to progress and the states that are found in advance. The peak frequency of the estimation target rechargeable battery is computed from the arc-shaped curve in the graph plotting the impedances at the respective frequencies represented by the measurement data acquired for the estimation target rechargeable battery. The relational expression $w=F(x)$ is used to estimate a state of the estimation target rechargeable battery from this peak frequency. Therefore, the capacity of a rechargeable battery employing a solid-state electrolyte may be estimated accurately by using the relational expression $w=F(x)$ representing the relationship between peak frequencies $x$ and capacities $w$.

In a state estimation method according to a fourth aspect, in the state estimation method according to the third aspect, the relational expression $w=F(x)$ includes a term $a \cdot \log x$ and a term $b$, $a$ and $b$ being constants.

In the state estimation method according to the fourth aspect, the relational expression $w=F(x)$ representing the relationship between peak frequencies $x$ and capacities $w$ includes the term $a \cdot \log x$ and the term $b$. Consequently, the state of a rechargeable battery employing a solid-state electrolyte may be estimated more accurately.

A fifth aspect is a state estimation method for estimating a state of a rechargeable battery that uses a solid-state electrolyte, the state estimation method including: acquiring measurement data of a reference rechargeable battery before and after a test that causes deterioration to progress, the measurement data being impedances at respective frequencies that are measured by an impedance method; computing peak frequencies and arc chord lengths before and after the test from arc-shaped curves in graphs plotting the impedances at the respective frequencies represented by the measurement data; based on the computed peak frequencies and the arc chord lengths before and after the test, obtaining a model that represents a relationship between the peak frequencies and the arc chord lengths; acquiring measurement data of an estimation target rechargeable battery, the measurement data being impedances at respective frequencies that are measured by the impedance method; computing a peak frequency and an arc chord length from an arc-shaped curve in a graph plotting the impedances at the respective frequencies represented by the measurement data; and estimating a state of the estimation target rechargeable battery from the peak frequency and an arc chord length of the estimation a target rechargeable battery, the estimating including using the model.

In the state estimation method according to the fifth aspect, the measurement data of the reference rechargeable battery, which is impedances at respective frequencies measured by the impedance method before and after the test that causes deterioration to progress, is acquired. The peak frequencies and arc chord lengths before and after the test are computed from arc-shaped curves in graphs plotting the impedances at the respective frequencies represented by the measurement data. The meaning of the term "arc chord length" as used herein is not strictly necessarily a mathematical chord length and may include, for example, a difference between the real components of respective points that are closest to the real axis approximately at the two ends of an arc-shaped curve in a graph.

On the basis of the computed peak frequencies and arc chord lengths from before and after the test, a model representing the relationship between peak frequencies and arc chord lengths is obtained. For an estimation target rechargeable battery, measurement data that is impedances at respective frequencies measured by the impedance method is acquired.

A peak frequency and arc chord length are computed from an arc-shaped curve in a graph plotting the impedances at the respective frequencies represented by this measurement data. Using the model, the state of the estimation target rechargeable battery is estimated from the peak frequency and arc chord length of the estimation target rechargeable battery.

In this state estimation method, the model representing the relationship between peak frequencies and arc chord lengths is found on the basis of the peak frequencies and arc chord lengths computed for before and after the test that causes deterioration of the reference rechargeable battery to progress. The peak frequency and arc chord length of the estimation target rechargeable battery are computed from the arc-shaped curve in the graph plotting the impedances at the respective frequencies represented by the measurement data acquired for the estimation target rechargeable battery. Because the model is used to estimate the state of the estimation target rechargeable battery from this peak frequency and arc chord length, the state of a rechargeable battery employing a solid-state electrolyte may be estimated with consideration for physical deterioration.

In a state estimation method according to a sixth aspect, in the state estimation method according to the fifth aspect, the test is a test that causes deterioration in accordance with chemical change to progress, the state is a degree of physical deterioration, the model is a relational expression y=F(x) representing a relationship between peak frequencies x and arc chord lengths y, and the degree of physical deterioration of the estimation target rechargeable battery is estimated based on a comparison between the peak frequency and the arc chord length of the estimation target rechargeable battery and the relational expression y=F(x).

In the state estimation method according to the sixth aspect, the relational expression y=F(x) representing the relationship between peak frequencies x and arc chord lengths y is found on the basis of the peak frequencies and arc chord lengths computed for before and after the test that causes deterioration of the reference rechargeable battery to progress in accordance with chemical change. The peak frequency and arc chord length of the estimation target rechargeable battery are computed from the arc-shaped curve in the graph plotting the impedances at the respective frequencies represented by the measurement data acquired for the estimation target rechargeable battery. The degree of physical deterioration of the estimation target rechargeable battery is estimated on the basis of a comparison of the computed peak frequency and arc chord length with the relational expression y=F(x). Therefore, the degree of physical deterioration of a rechargeable battery employing a solid-state electrolyte may be estimated.

In a state estimation method according to a seventh aspect, in the state estimation method according to the sixth aspect, estimating the degree of physical deterioration of the estimation target rechargeable battery includes estimating the degree of physical deterioration based on a comparison between an arc chord length y1 of the estimation target rechargeable battery and an arc chord length y2 that is obtained by substituting a peak frequency x1 of the estimation target rechargeable battery into the relational expression y=F(x).

In the state estimation method according to the seventh aspect, the arc chord length y2 is obtained by substituting the peak frequency x1 of the estimation target rechargeable battery into the relational expression y=F(x), and the degree of physical deterioration of the estimation target rechargeable battery is estimated on the basis of a comparison between the arc chord length y1 of the estimation target rechargeable battery and the arc chord length y2. Therefore, the degree of physical deterioration of a rechargeable battery employing a solid-state electrolyte may be estimated accurately.

In a state estimation method according to an eighth aspect, in the state estimation method according to the seventh aspect, the relational expression y=F(x) includes a term $ax^b$, a and b being constants.

In the state estimation method according to the eighth aspect, the relational expression y=F(x) representing the relationship between peak frequencies x and arc chord lengths y includes the term $ax^b$, in which a and b are constants. Consequently, the degree of physical deterioration of a rechargeable battery employing a solid-state electrolyte may be estimated more accurately.

In a state estimation method according to a ninth aspect, in the state estimation method according to any one of the sixth to eighth aspects, the test that causes deterioration in accordance with chemical change to progress is a test that holds a constant voltage in a charged state.

In the state estimation method according to the ninth aspect, the test that holds the reference rechargeable battery at a constant voltage in the charged state and causes deterioration of the reference rechargeable battery to progress in accordance with chemical changes is conducted, and the measurement data that is impedances at respective frequencies measured by the impedance method is acquired. Therefore, the relational expression y=F(x) representing the relationship between peak frequencies x and arc chord lengths y may be found accurately.

A tenth aspect is a state estimation device that estimates a state of a rechargeable battery that uses a solid-state electrolyte, the state estimation device including: a first acquisition section that acquires measurement data and states of a reference rechargeable battery before and after a test that causes deterioration to progress, the measurement data being impedances at respective frequencies that are measured by an impedance method, and the states being found in advance; a derivation section that computes peak frequencies before and after the test from arc-shaped curves in graphs plotting the impedances at the respective frequencies represented by the measurement data and, based on the computed peak frequencies before and after the test and the states found in advance, obtains a model that represents a relationship between the peak frequencies and the states; a second acquisition section that acquires measurement data of an estimation target rechargeable battery, the measurement data being impedances at respective frequencies that are measured by the impedance method; a computation section that computes a peak frequency from an arc-shaped curve in a graph plotting the impedances at the respective frequencies represented by the measurement data; and an estimation section that uses the model to estimate a state of the estimation target rechargeable battery from the peak frequency of the estimation target rechargeable battery.

In the state estimation device according to the tenth aspect, the first acquisition section acquires the measurement data and states found in advance of the reference rechargeable battery. The measurement data is impedances at respective frequencies, measured by the impedance method before and after the test that causes deterioration to progress.

The derivation section computes peak frequencies before and after the test from arc-shaped curves in graphs plotting the impedances at the respective frequencies represented by the measurement data. On the basis of the computed peak frequencies and the states found in advance from before and after the test, the computation section obtains a model representing the relationship between peak frequencies and states.

The second acquisition section acquires measurement data for the estimation target rechargeable battery that is impedances at respective frequencies measured by the impedance method. The computation section computes a peak frequency from an arc-shaped curve in a graph plotting the impedances at the respective frequencies represented by this measurement data. The estimation section then uses the model to estimate the state of the estimation target rechargeable battery from the peak frequency of the estimation target rechargeable battery.

In this state estimation device, the model representing the relationship between peak frequencies and states is found on the basis of the peak frequencies computed for before and after the test that causes deterioration of the reference rechargeable battery to progress and the states that are found in advance. The peak frequency of the estimation target rechargeable battery is computed from the arc-shaped curve in the graph plotting the impedances at the respective frequencies represented by the measurement data acquired for the estimation target rechargeable battery. Because the model is used to estimate the state of the estimation target rechargeable battery from this peak frequency, the state of a rechargeable battery employing a solid-state electrolyte may be estimated with consideration for physical deterioration.

An eleventh aspect is a state estimation device that estimates a state of a rechargeable battery that uses a solid-state electrolyte, the state estimation device including: a first acquisition section that acquires measurement data of a reference rechargeable battery before and after a test that causes deterioration to progress, the measurement data being impedances at respective frequencies that are measured by an impedance method; a derivation section that computes peak frequencies and arc chord lengths before and after the test from arc-shaped curves in graphs plotting the impedances at the respective frequencies represented by the measurement data and, based on the computed peak frequencies and the arc chord lengths before and after the test, obtains a model that represents a relationship between the peak frequencies and the arc chord lengths; a second acquisition section that acquires measurement data of an estimation target rechargeable battery, the measurement data being impedances at respective frequencies that are measured by the impedance method; a computation section that computes a peak frequency and an arc chord length from an arc-shaped curve in a graph plotting the impedances at the respective frequencies represented by the measurement data; and an estimation section that uses the model to estimate a state of the estimation target rechargeable battery from the peak frequency and an arc chord length of the estimation target rechargeable battery.

In the state estimation device according to the eleventh aspect, the first acquisition section acquires the measurement data of the reference rechargeable battery. The measurement data is impedances at respective frequencies, measured by the impedance method before and after the test that causes deterioration to progress.

The derivation section computes peak frequencies and arc chord lengths before and after the test from arc-shaped curves in graphs plotting the impedances at the respective frequencies represented by the measurement data. On the basis of the computed peak frequencies and arc chord lengths from before and after the test, the computation section obtains a model representing the relationship between peak frequencies and arc chord lengths.

The second acquisition section acquires measurement data for the estimation target rechargeable battery that is impedances at respective frequencies measured by the impedance method. The computation section computes a peak frequency and arc chord length from an arc-shaped curve in a graph plotting the impedances at the respective frequencies represented by this measurement data. The estimation section uses the model to estimate the state of the estimation target rechargeable battery from the peak frequency and arc chord length of the estimation target rechargeable battery.

In this state estimation device, the model representing the relationship between peak frequencies and arc chord lengths is found on the basis of the peak frequencies and arc chord lengths computed for before and after the test that causes deterioration of the reference rechargeable battery to progress. The peak frequency and arc chord length for the estimation target rechargeable battery are computed from the arc-shaped curve in the graph plotting the impedances at the respective frequencies represented by the measurement data acquired for the estimation target rechargeable battery. Because the model is used to estimate the state of the estimation target rechargeable battery from this peak frequency and arc chord length, the state of a rechargeable battery employing a solid-state electrolyte may be estimated with consideration for physical deterioration.

A twelfth aspect is a program stored at a non-transitory storage medium, which program is for estimating a state of a rechargeable battery that uses a solid-state electrolyte, the program being executable by a computer to perform processing, the processing including: acquiring measurement data and states of a reference rechargeable battery before and after a test that causes deterioration to progress, the measurement data being impedances at respective frequencies that are measured by an impedance method, and the states being found in advance; computing peak frequencies before and after the test from arc-shaped curves in graphs plotting the impedances at the respective frequencies represented by the measurement data; based on the computed peak frequencies before and after the test and the states found in advance, obtaining a model that represents a relationship between the peak frequencies and the states; acquiring measurement data of an estimation target rechargeable battery, the measurement data being impedances at respective frequencies that are measured by the impedance method; computing a peak frequency from an arc-shaped curve in a graph plotting the impedances at the respective frequencies represented by the measurement data; and estimating a state of the estimation target rechargeable battery from the peak frequency of the estimation target rechargeable battery, the estimating including using the model.

A computer executing the program stored at the non-transitory storage medium according to the twelfth aspect acquires the measurement data and states found in advance of the reference rechargeable battery. The measurement data is impedances at respective frequencies, measured by the impedance method before and after the test that causes deterioration to progress. The computer computes peak frequencies before and after the test from arc-shaped curves in graphs plotting the impedances at the respective frequencies represented by the measurement data. On the basis of the computed peak frequencies and the states found in advance from before and after the test, the computer obtains a model representing the relationship between peak frequencies and states. The computer acquires measurement data for the estimation target rechargeable battery that is impedances at respective frequencies measured by the impedance method. The computer computes a peak frequency from an arc-shaped curve in a graph plotting the impedances at the respective frequencies represented by this measurement data. The computer uses the model to estimate the state of the estimation target rechargeable battery from the peak frequency of the estimation target rechargeable battery.

In this program, the model representing the relationship between peak frequencies and states is found on the basis of the peak frequencies computed for before and after the test that causes deterioration of the reference rechargeable battery to progress and the states that are found in advance. The peak frequency of the estimation target rechargeable battery is computed from the arc-shaped curve in the graph plotting the impedances at the respective frequencies represented by the measurement data acquired for the estimation target rechargeable battery. Because the model is used to estimate the state of the estimation target rechargeable battery from this peak frequency, the state of a rechargeable battery employing a solid-state electrolyte may be estimated with consideration for physical deterioration.

A thirteenth aspect is a program stored at a non-transitory storage medium, which program is for estimating a state of a rechargeable battery that uses a solid-state electrolyte, the program being executable by a computer to perform processing, the processing including: acquiring measurement data of a reference rechargeable battery before and after a test that causes deterioration to progress, the measurement data being impedances at respective frequencies that are measured by an impedance method; computing peak frequencies and arc chord lengths before and after the test from arc-shaped curves in graphs plotting the impedances at the respective frequencies represented by the measurement data; based on the computed peak frequencies and the arc chord lengths before and after the test, obtaining a model that represents a relationship between the peak frequencies and the arc chord lengths; acquiring measurement data of an estimation target rechargeable battery, the measurement data being impedances at respective frequencies that are measured by the impedance method; computing a peak frequency and an arc chord length from an arc-shaped curve in a graph plotting the impedances at the respective frequencies represented by the measurement data; and estimating a state of the estimation target rechargeable battery from the peak frequency and an arc chord length of the estimation target rechargeable battery, the estimating including using the model.

A computer executing the program stored at the non-transitory storage medium according to the thirteenth aspect acquires the measurement data of the reference rechargeable battery. The measurement data is impedances at respective frequencies, measured by the impedance method before and after the test that causes deterioration to progress. The computer computes peak frequencies and arc chord lengths before and after the test from arc-shaped curves in graphs plotting the impedances at the respective frequencies represented by the measurement data. On the basis of the computed peak frequencies and arc chord lengths from before and after the test, the computer obtains a model representing the relationship between peak frequencies and arc chord lengths. The computer acquires measurement data for the estimation target rechargeable battery that is impedances at respective frequencies measured by the impedance method. The computer computes a peak frequency and arc chord length from an arc-shaped curve in a graph plotting the impedances at the respective frequencies represented by this measurement data. The computer uses the model to estimate the state of the estimation target rechargeable battery from the peak frequency and arc chord length of the estimation target rechargeable battery.

In this program, the model representing the relationship between peak frequencies and arc chord lengths is found on the basis of the peak frequencies and arc chord lengths computed for before and after the test that causes deterioration of the reference rechargeable battery to progress. The peak frequency and arc chord length of the estimation target rechargeable battery are computed from the arc-shaped curve in the graph plotting the impedances at the respective frequencies represented by the measurement data acquired for the estimation target rechargeable battery. Because the model is used to estimate the state of the estimation target rechargeable battery from this peak frequency and arc chord length, the state of a rechargeable battery employing a solid-state electrolyte may be estimated with consideration for physical deterioration.

Advantageous Effects of Invention

According to the present disclosure, a state of a rechargeable battery employing a solid-state electrolyte may be estimated with consideration for physical deterioration.

BRIEF DESCRIPTION OF THE DRAWINGS

Exemplary embodiments of the present disclosure will be described in detail based on the following figures, wherein.

DETAILED DESCRIPTION

First Exemplary Embodiment

—Overall Structure—

Figure 1:
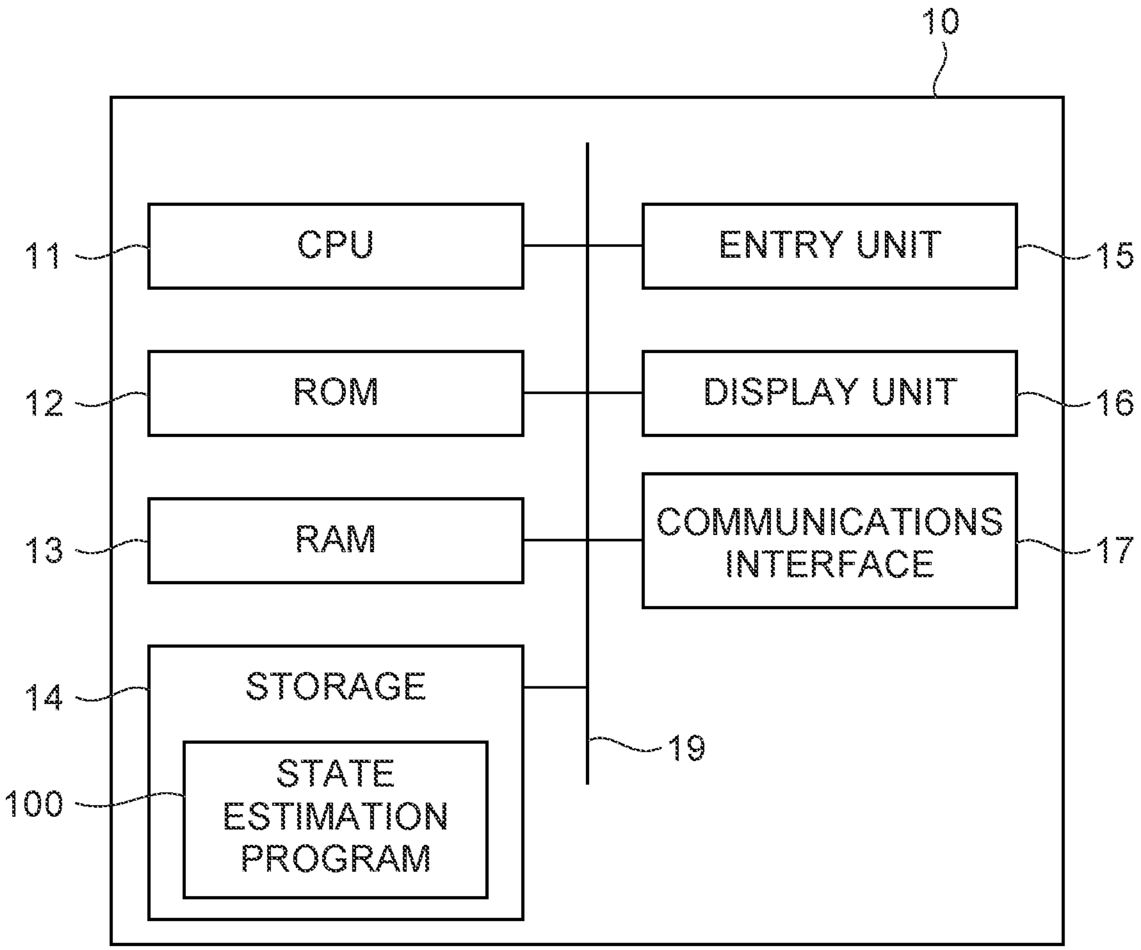
FIG. 1 is a schematic block diagram of an example of a computer that functions as a state estimation device according to a present exemplary embodiment.

FIG. 1 is a block diagram showing hardware structures of a state estimation device 10 according to a first exemplary embodiment.

As shown in FIG. 1, the state estimation device 10 includes a central processing unit (CPU) 11, read-only memory (ROM) 12, random access memory (RAM) 13, storage 14, an entry unit 15, a display unit 16 and a communications interface 17. These structures are connected to be capable of communicating with one another via a bus 19. The CPU 11 is an example of a processor, and the RAM 13 is an example of memory.

The CPU 11 is a central arithmetic processing unit that executes various programs and controls respective parts. That is, the CPU 11 reads a program from the ROM 12 or the storage 14, and executes the program using the RAM 13 as a workspace. The CPU 11 performs control of the structures described above and various kinds of computational processing and the like in accordance with programs memorized in the ROM 12 or the storage 14. In the present exemplary embodiment, a state estimation program 100 is stored in the storage 14. The state estimation program 100 may be a single program, and may be plural programs or a program group structured by modules.

The ROM 12 stores various programs and various kinds of data. The RAM 13 serves as a workspace, temporarily memorizing programs and data. The storage 14 is constituted by a hard disk drive (HDD) or solid state drive (SSD). The storage 14 stores various programs, including an operating system, and various kinds of data.

The entry unit 15 includes a pointing device such as a mouse or the like and a keyboard, and is used for various kinds of entry.

As entries, the entry unit 15 accepts combinations of measurement data and capacities of the all-solid-state battery for before and after a test that causes deterioration of a reference all-solid-state battery to progress. The measurement data is impedances at respective frequencies, measured by an impedance method. The capacities are found in advance.

More specifically, first an all-solid-state battery as illustrated below is fabricated, structured with a positive electrode layer, a solid-state electrolyte layer and a negative electrode layer.

The positive electrode layer is constituted with $LiNi_{0.5}Co_{0.2}Mn_{0.3}O_2$, a sulfide solid-state electrolyte with an argyrodite structure, conductive carbon and a binder. The solid-state electrolyte layer is constituted with a sulfide solid-state electrolyte with an argyrodite structure and a binder. The negative electrode layer is constituted with graphite, a sulfide solid-state electrolyte with an argyrodite structure, and a binder.

A slurry in which the constituent materials of the positive electrode layer are dispersed in an organic solvent is coated onto an aluminium foil and then dried to fabricate a positive electrode layer sheet. A slurry in which the constituent materials of the solid-state electrolyte layer are dispersed in an organic solvent is coated onto a gold foil and then dried to fabricate a solid-state electrolyte layer sheet. A slurry in which the constituent materials of the negative electrode layer are dispersed in an organic solvent is coated onto a gold foil and then dried to fabricate a negative electrode layer sheet.

Subsequently, the coated surfaces of the solid-state electrolyte sheet and the negative electrode sheet are opposed with one another and pressed to transfer the solid-state electrolyte layer onto the negative electrode layer. The negative electrode sheet onto which the solid-state electrolyte has been transferred and the positive electrode sheet are superposed such that the positive electrode layer, solid-state electrolyte layer and negative electrode layer are laminated in this order, and are pressed. Thus, the layers are joined to one another and the positive electrode layer, solid-state electrolyte layer and negative electrode layer are densified. This is then sealed in a lamination film to provide an all-solid-state battery. In order to assure performance of the all-solid-state battery, the all-solid-state battery is confined in a jig that applies predetermined surface pressure to the electrode surfaces.

A charging and discharging test is carried out to electrically charge and discharge the all-solid-state battery fabricated as described above under predetermined conditions (for example, 25° C., charge rate 0.1 C), and a capacity of the all-solid-state battery is calculated. Subsequently, the State of Charge (SoC) is adjusted to 50%, and AC impedance measurements are conducted at 25° C. to obtain measurement data.

A cycling test is then conducted to charge and discharge the all-solid-state battery under conditions of 60° C., 1 C. After 100 cycles and after 200 cycles, the all-solid-state battery is removed, the charging and discharging test is conducted at 25° C., 0.1 C, and the capacity of the all-solid-state battery is calculated. AC impedance measurements are carried out with an SoC of 50% to obtain measurement data.

Thus, combinations of measurement data, which is impedances at respective frequencies measured by the impedance method, with capacities of the all-solid-state battery that are found in advance are prepared for a reference all-solid-state battery for before and after a test that causes deterioration to progress. The entry unit 15 accepts the combinations of measurement data and capacities of the reference all-solid-state battery from before and after the test that causes deterioration to progress.

Hence, the entry unit 15 accepts entries that are measurement data, which is impedances at respective frequencies measured by the impedance method, of an estimation target all-solid-state battery whose capacity is unknown.

More specifically, a charging and discharging test is carried out to charge and discharge the estimation target all-solid-state battery, which is fabricated in a similar manner to the reference all-solid-state battery described above, under predetermined conditions (for example, 25° C., 0.1 C), after which the SoC is adjusted to 50%, and AC impedance measurements are conducted at 25° C. to obtain measurement data.

The display unit 16 is, for example, a liquid crystal display and displays various kinds of information. The display unit 16 that is employed may be a touch panel and may also function as the entry unit 15.

The communications interface 17 is an interface for communicating with other equipment and employs a standard such as, for example, Ethernet (registered trademark), Fiber Distributed Data Interface (FDDI), Wi-Fi (registered trademark) or the like.

Now, in a Cole-Cole plot of results obtained by an AC impedance method from an all-solid-state battery, in which real components Z' of the results are plotted on the horizontal axis and imaginary components Z" are plotted on the vertical axis, an arc-shaped curve appears due to resistance in charging and discharging reactions of the battery. When the all-solid-state battery deteriorates, a chord length of this arc increases and a frequency (below referred to as "the peak frequency") that produces a peak of the arc (a point at which absolute values of the imaginary components are at a maximum) decreases. The capacity of the all-solid-state battery decreases along with the deterioration. The inventors of the present disclosure have discovered that a relationship between peak frequencies x and capacities w that change as the deterioration progresses may be mathematically expressed in the form w=F(x), regardless of charging and discharging conditions that lead to the deterioration, and have further discovered that a good approximation is provided in the form w=a·log x+b (in which a and b are constants). To improve the precision of this approximation, a correction term may be included in the form w=a·log x+b+D (in which D is the correction term).

In theory, this may be explained as follows.

Generally, a battery capacity in practice depends on the capacity of the active material itself and on battery resistance. The reason the battery resistance has an effect is that when the resistance is larger, over-voltages during charging and discharging are larger. Thus, an upper limit voltage may be reached during charging before a limit capacity of the active material is reached, and a lower limit voltage may be reached during discharging.

The AC impedance method is a simple technique for measuring resistance of a battery. A Cole-Cole plot is illustrated in which real components of impedances obtained by this measurement method are plotted on the horizontal axis and imaginary components are plotted on the vertical axis. In this plot, a curve with an arc shape caused by the resistance of battery reactions is obtained. A chord length of this arc may be used as an index of resistance of battery reactions. However, because measurement conditions differ from actual battery resistances during charging and discharging, resistances during charging and discharging commonly do not match and magnitude relationships of battery capacities do not necessarily correlate.

In a deteriorating battery, the resistance expressed as the arc chord length incorporates the effects of a rise in charge transfer resistance caused by the formation of a resistance layer at a boundary face between an active material and an electrolyte, a fall in contact area of the boundary face between the active material and the electrolyte, and a rise in ionic conduction resistance in the thickness direction of an electrode. Of these factors, it is theoretically understood that the peak frequency decreases with the rise in charge transfer resistance but the peak frequency is substantially constant when the contact area and the ionic conduction resistance change. It is thought that a reason for the strong correlation between capacity and peak frequency is that a rise in charge transfer resistance caused by the formation of a resistance layer has a large effect contributing to a decrease in capacity, and thus charge transfer resistance strongly correlates with peak frequency.

Figure 2:
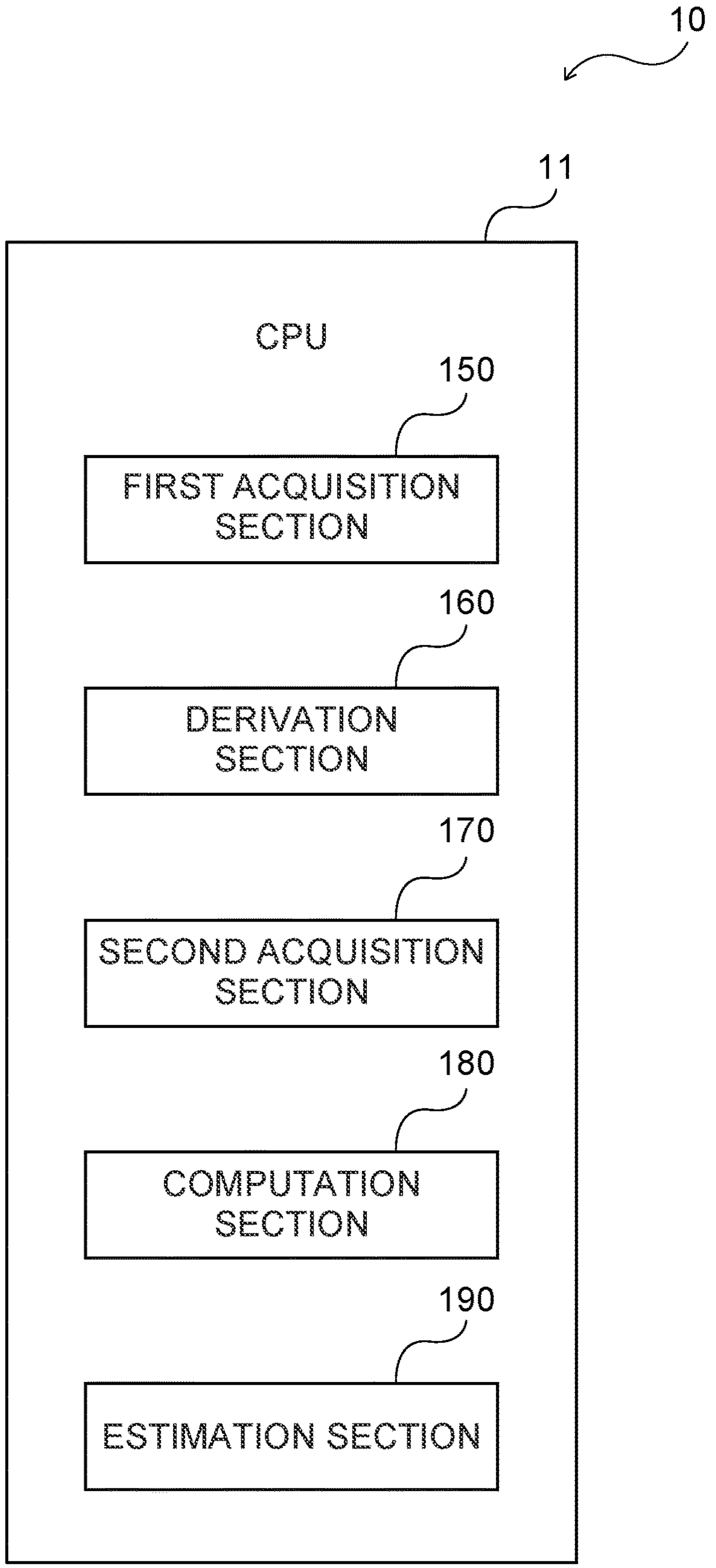
FIG. 2 is a block diagram showing functional structures of the state estimation device according to the present exemplary embodiment.

Accordingly, in the present exemplary embodiment as illustrated in FIG. 2, the CPU 11 of the state estimation device 10 executes the state estimation program 100 and functions as a first acquisition section 150, a derivation section 160, a second acquisition section 170, a computation section 180 and an estimation section 190.

The first acquisition section 150 acquires measurement data and capacities of a reference all-solid-state battery. The measurement data is impedances at respective frequencies measured by the impedance method before and after a test that causes deterioration to progress. The capacities are found in advance.

The derivation section 160 computes peak frequencies from the arc-shaped curves in the graphs plotting the impedances at the respective frequencies represented by the measurement data acquired by the first acquisition section 150, and finds a relational expression w=F(x) representing the relationship between peak frequencies x and capacities w. This relational expression w=F(x) includes the terms a·log x and the term b, in which a and b are constants.

Figure 3:
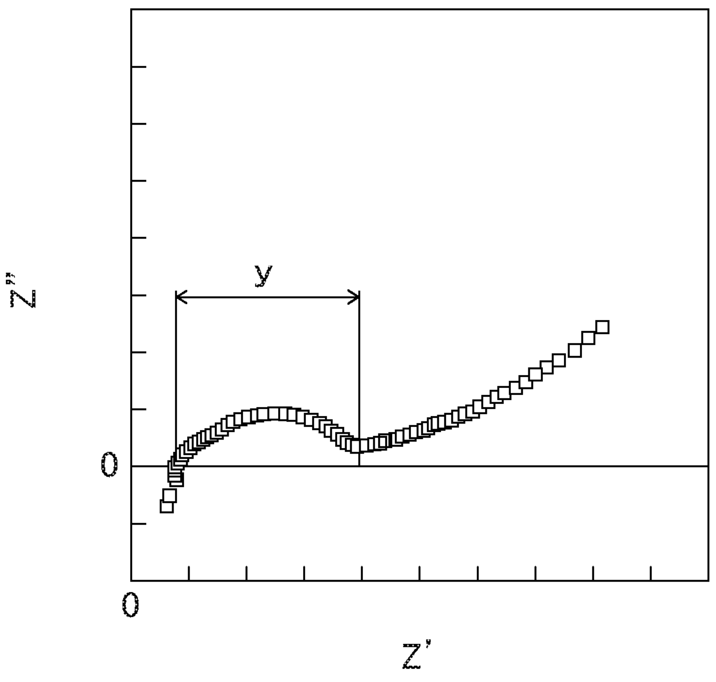
FIG. 3 is a diagram showing an example of a graph plotting impedances at respective frequencies.
Figure 4:
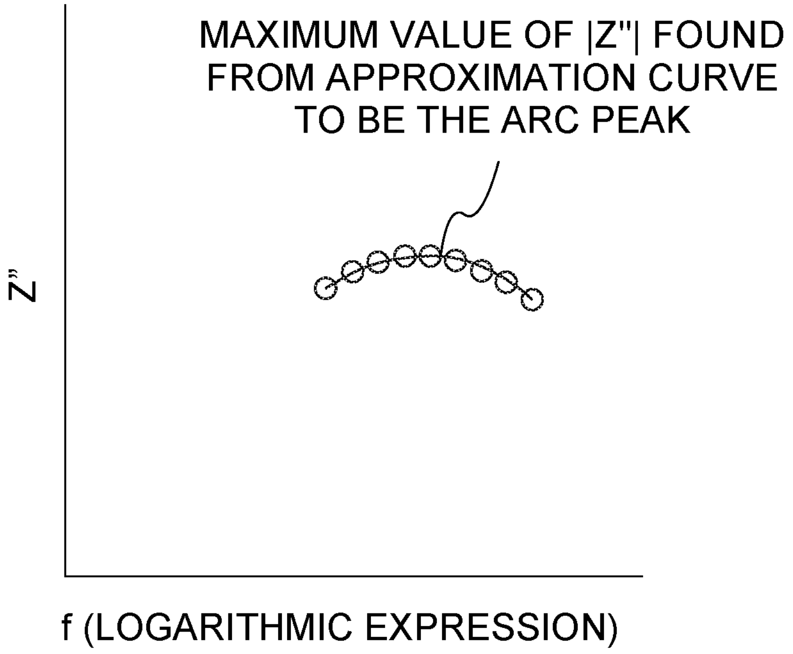
FIG. 4 is a diagram describing a peak frequency.

To be specific, a Cole-Cole plot obtained from AC impedance measurements before a cycling test is illustrated in FIG. 3. A relationship between peak frequencies of arcs and imaginary components of impedance is illustrated in FIG. 4. The relationship in FIG. 3 may be expressed in the form of the following relationship between logarithms of frequency (represented by f) and absolute values of the imaginary components Z".

$$|Z''|=k(\log f)^2+l(\log f)+m$$

The terms k, l and m are constants, which are found by the least squares method. The frequency f that produces the greatest value of |Z"| is found to serve as the peak frequency x, which is used as the peak frequency from before the cycling test. A difference between the real components of points at the two ends of the arc that are closest to the real value axis in FIG. 3 is computed to serve as the arc chord length y, which serves as the arc chord length from before the cycling test.

The arc chord length and peak frequency from after the cycling test are computed by the same procedure.

The peak frequencies x found by the method described above and their logarithms, the arc chord lengths y and their logarithms, and the capacities w are illustrated in table 1 as relative values, with the values from before the cycling test being set to 1.

TABLE 1

| Cycles | Peak frequency x | Log of peak frequency x | Arc chord length y | Log of arc chord length y | Discharge capacity w |
|---|---|---|---|---|---|
| 0 | 1.000 | 0.00 | 1.000 | 0.00 | 1.000 |
| 100 | 0.206 | −0.69 | 3.461 | 0.54 | 0.816 |
| 200 | 0.102 | −0.99 | 5.650 | 0.75 | 0.740 |

Figure 5:
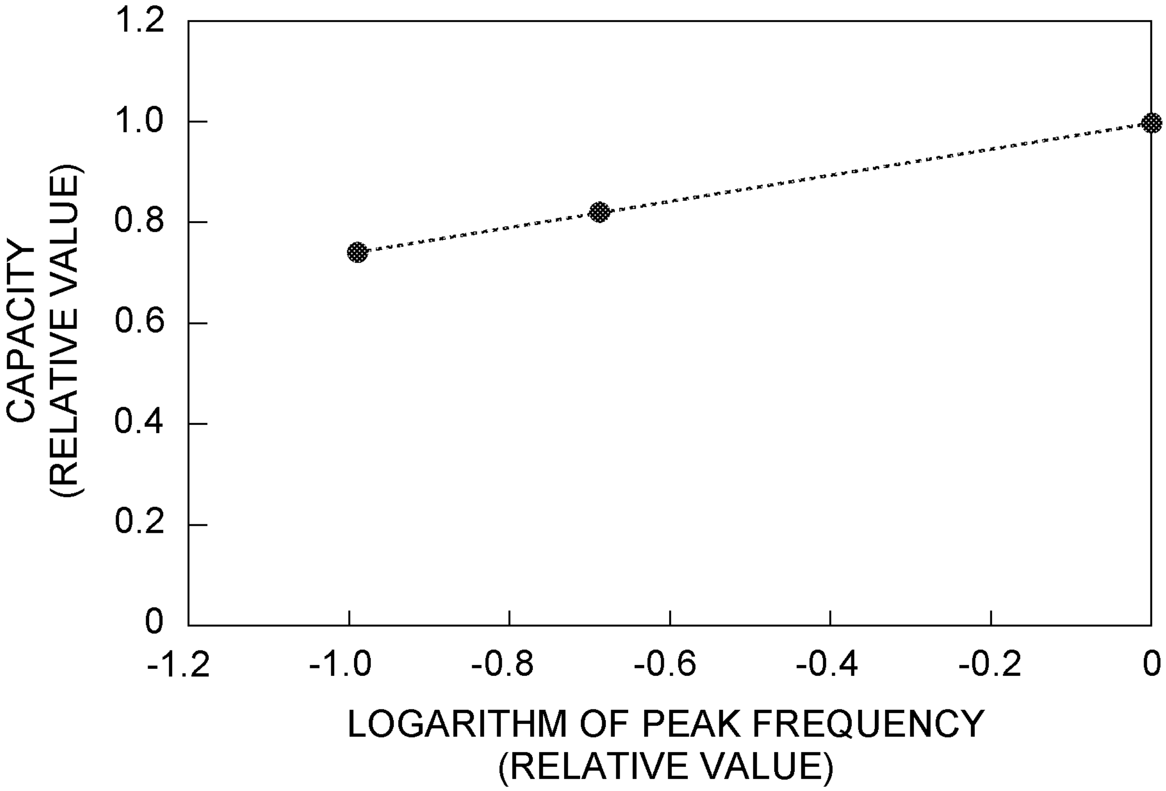
FIG. 5 is a graph showing a relationship between peak frequencies and capacities.

A correspondence relationship between the relative values of the logarithms log x of the peak frequencies x and the relative values of the capacities w can be represented by a straight line as illustrated in FIG. 5. Through the least squares method, for example, the following relational expression 1 is obtained.

$$w=a\cdot\log x+b \qquad \text{(relational expression 1)}$$

The second acquisition section 170 acquires measurement data of an estimation target rechargeable battery, which is impedances at respective frequencies measured by the impedance method.

The computation section 180 computes a peak frequency from an arc-shaped curve in a graph plotting the impedances at the respective frequencies represented by the measurement data acquired by the second acquisition section 170.

The estimation section 190 substitutes the peak frequency of the estimation target rechargeable battery into relational expression 1 and estimates the capacity of the estimation target rechargeable battery. The estimated capacity is displayed through the display unit 16.

Operation of the State Estimation Device According to the First Exemplary Embodiment Now, operation of the state estimation device 10 according to the first exemplary embodiment is described.

Figure 6:
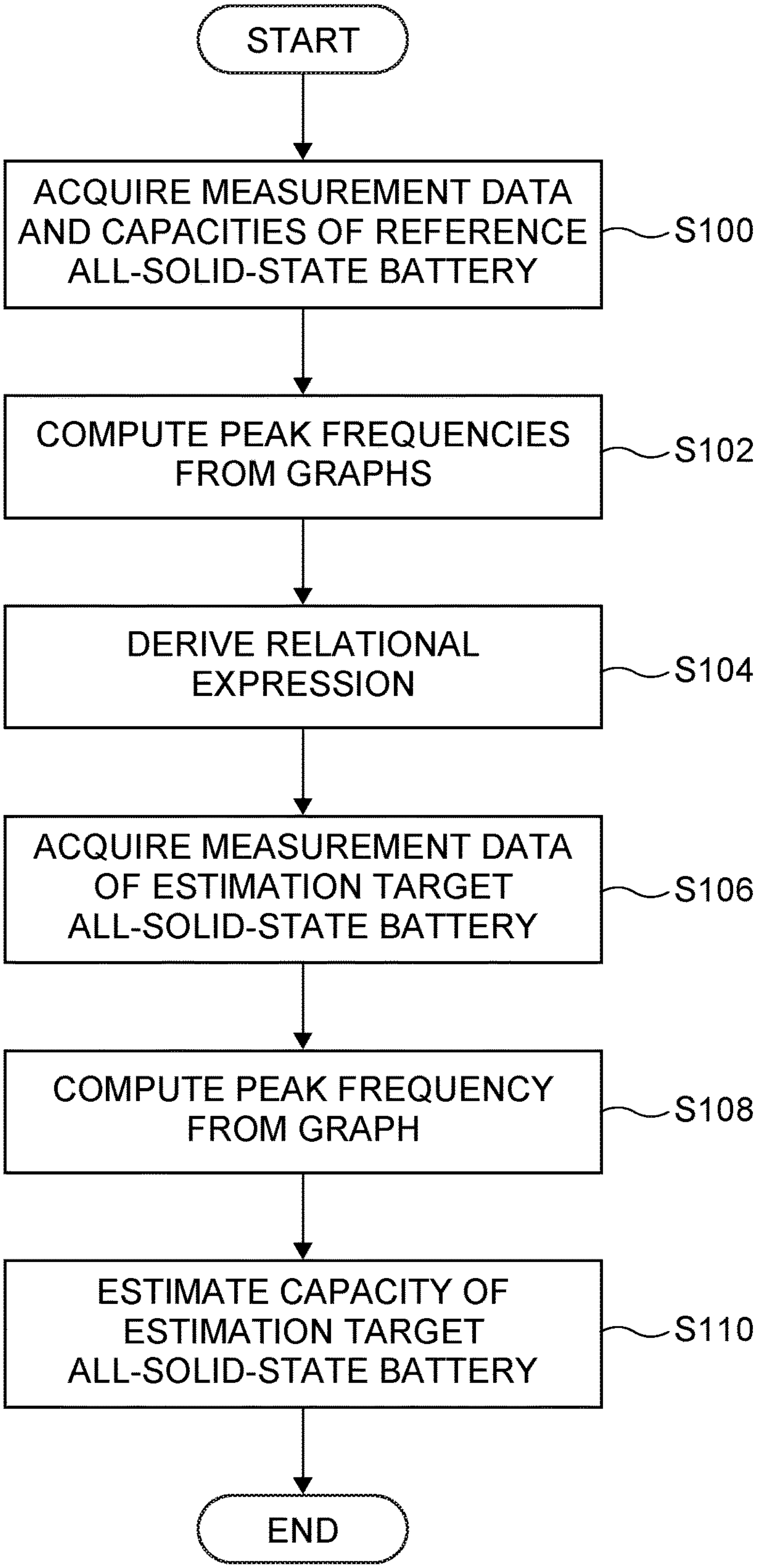
FIG. 6 is a flowchart showing a flow of state estimation processing that is executed at a state estimation device according to a first exemplary embodiment.

FIG. 6 is a flowchart showing a flow of state estimation processing by the state estimation device 10. The CPU 11 implements the state estimation processing by reading the state estimation program 100 from the storage 14, loading the state estimation program 100 to the RAM 13 and executing the state estimation program 100. Combinations for the reference all-solid-state battery from before and after the test that causes deterioration to progress, of the measurement data that is impedances at respective frequencies measured by the impedance method and the capacities that are found in advance, are entered into the state estimation device 10 and stored at the storage 14.

The measurement data of the estimation target all-solid-state battery that is impedances at respective frequencies measured by the impedance method is also entered into the state estimation device 10 and stored at the storage 14.

In step S100, the CPU 11 serves as the first acquisition section 150 and acquires the measurement data of the reference all-solid-state battery that is impedances at respective frequencies measured by the impedance method before and after the test that causes deterioration to progress and capacities that are found in advance.

In step S102, the CPU 11 serves as the derivation section 160 and, in graphs plotting the impedances at respective frequencies represented by the measurement data acquired in step S100, computes peak frequencies from arc-shaped curves.

In step S104, the CPU 11 serves as the derivation section 160 and obtains the relational expression w=F(x) representing the relationship between peak frequencies and capacities.

In step S106, the CPU 11 serves as the second acquisition section 170 and acquires the measurement data of the estimation target all-solid-state battery that is impedances at respective frequencies measured by the impedance method.

In step S108, the CPU 11 serves as the computation section 180 and, in a graph plotting the impedances at respective frequencies represented by the measurement data acquired in step S106, computes a peak frequency from an arc-shaped curve.

In step S110, the CPU 11 serves as the estimation section 190, uses relational expression 1 to estimate a capacity of the estimation target all-solid-state battery from the peak frequency of the estimation target all-solid-state battery, displays the estimated capacity with the display unit 16, and ends the state estimation processing.

Example 1

An Example in which the state estimation device 10 according to the first exemplary embodiment described above is used to estimate a capacity is described.

Cells with the same specifications as a reference all-solid-state battery were used as estimation target all-solid-state batteries, one cell being subjected to 300 cycles of a cycling test at 60° C., 1 C (condition 1) and one cell being subjected to 300 cycles of the cycling test at 25° C., 1 C (condition 2). Capacities w1, peak frequencies x1 and arc chord lengths y1 were acquired by methods the same as the methods described above for the first exemplary embodiment.

To simulate deterioration resulting from a reduction in contact area between particles due to expansion and contraction of an active material, cells were fabricated in which boundary contact performance of structural materials is intentionally lowered by a reduction in electrode pressing pressure during battery fabrication. The capacity w1, peak frequency x1 and arc chord length y1 without the cycling test were acquired by methods the same as the methods described above for the first exemplary embodiment (condition 3).

Results of using relational expression 1 to compute estimated capacities w2 for the peak frequencies x1 obtained from conditions 1 to 3 are shown in table 2.

TABLE 2

| | History before estimation | Peak frequency x1 | Log of peak frequency x1 | Arc chord length y1 | Log of arc chord length y1 | Measured capacity w1 | Estimated capacity w2 |
|---|---|---|---|---|---|---|---|
| Condition 1 | 60° C., 300 cycles | 0.071 | −1.15 | 7.312 | 0.86 | 0.679 | 0.697 |
| Condition 2 | 25° C., 300 cycles | 0.602 | −0.22 | 1.565 | 0.19 | 0.951 | 0.941 |
| Condition 3 | Low pressing pressure | 0.559 | −0.25 | 23.800 | 1.38 | 0.930 | 0.933 |

Figure 7:
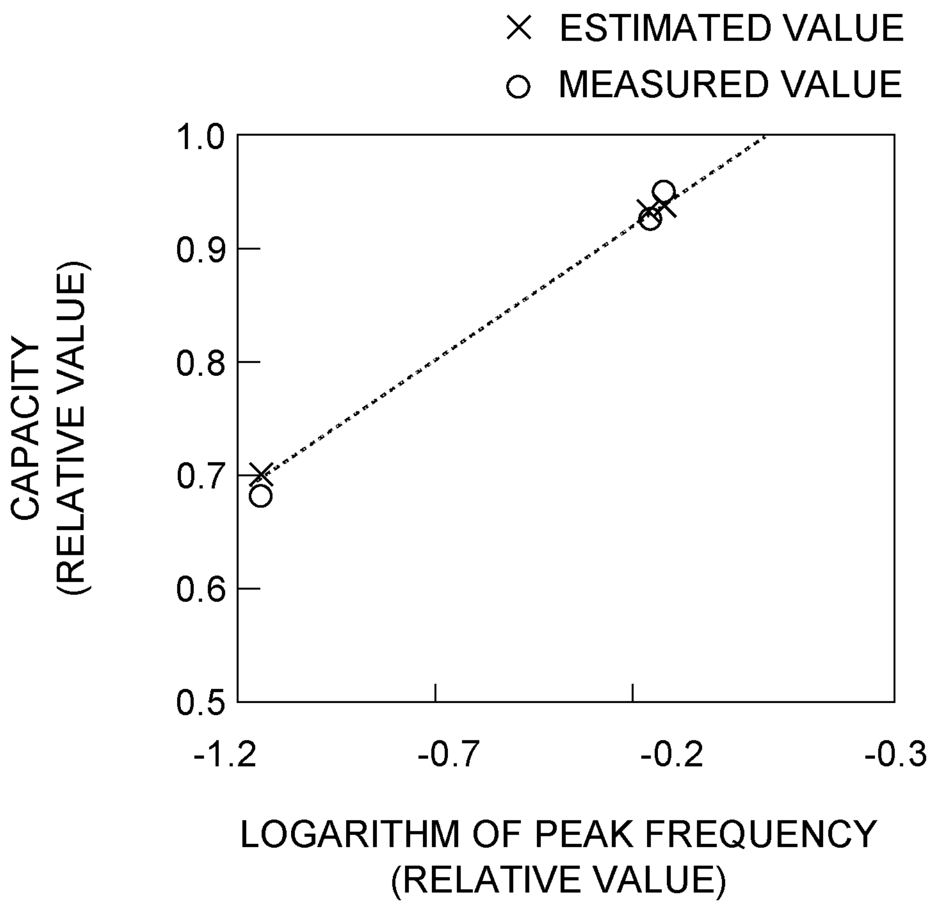
FIG. 7 is a graph showing a relationship between peak frequencies and capacities in Example 1.

The relationship between measured values of peak frequency and capacity and the relationship between estimated values of peak frequency and capacity are illustrated in FIG. 7. As can be seen in FIG. 7, the capacities may be accurately estimated with the estimated values being close to the measured values.

Figure 8:
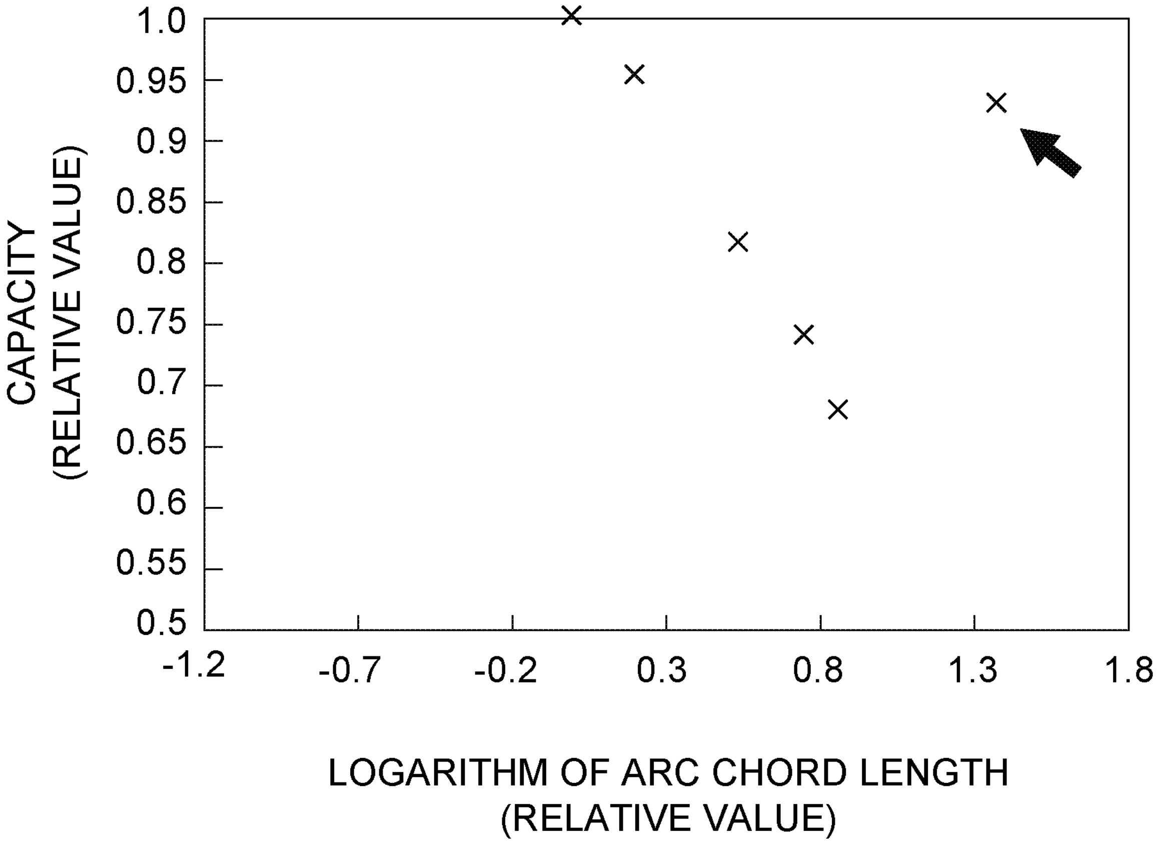
FIG. 8 is a graph showing a relationship between arc chord lengths and capacities in Example 1.

Now, the relationship between arc chord length and capacity is described. In general, when a battery resistance is high, the capacity tends to be lower. Therefore, it is thought possible to estimate the capacity from the arc chord length that is associated with a battery resistance component. When the relationship between logarithms of arc chord length and capacities is illustrated for all of the data described above for the present exemplary embodiment, as in FIG. 8, a broadly linear relationship can be seen. However, one point is distant from the linear relationship (see the arrow in FIG. 8). This distant data corresponds to condition 3 in which the pressing pressure was lowered. Thus, it can be understood that it may not be possible to accurately estimate the capacity for a deterioration in which physical contact performance within electrodes is lowered.

Figure 9:
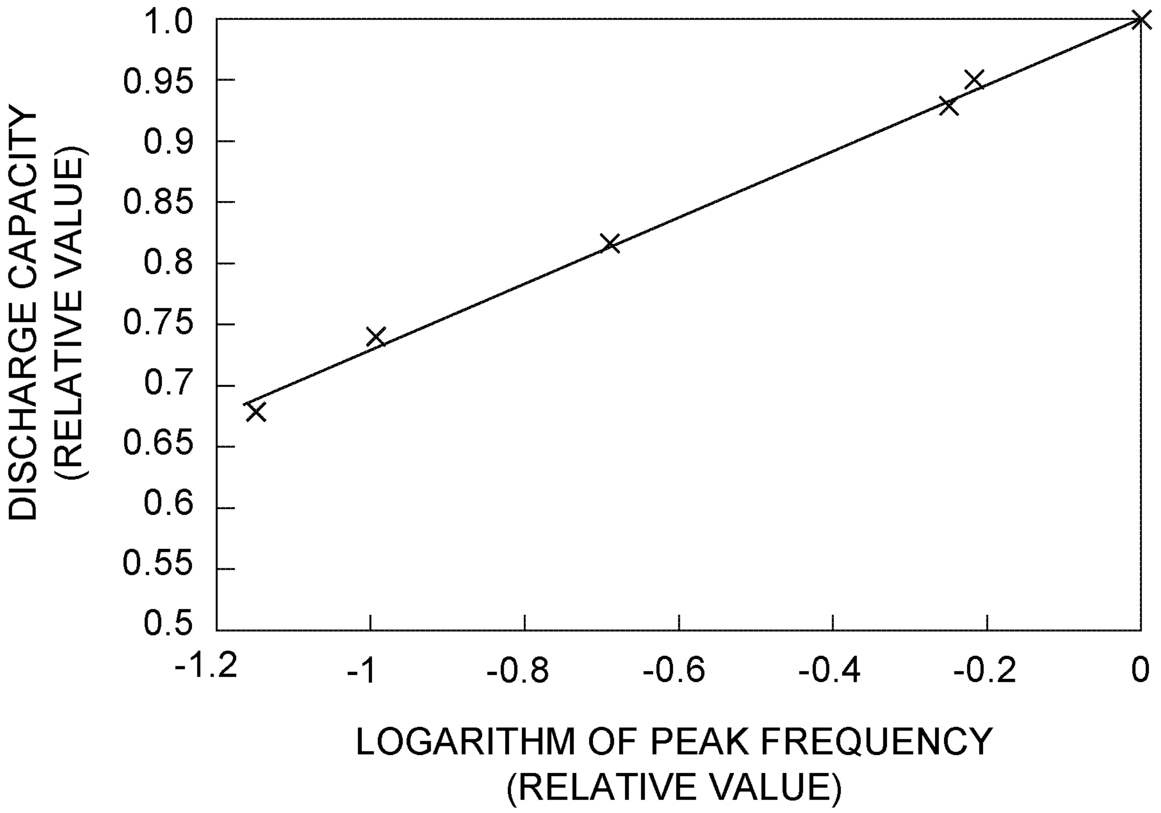
FIG. 9 is a graph showing a relationship between peak frequencies and capacities in Example 1.

However, when a relationship between the logarithms of peak frequencies and capacities is illustrated as in FIG. 9, it can be seen that the capacity may be estimated accurately for a deterioration in which physical contact performance is lowered.

Overview of the Exemplary Embodiment

The state estimation device 10 according to the present exemplary embodiment finds a relational expression representing a relationship between peak frequencies and capacities, on the basis of peak frequencies computed for before and after the test that causes deterioration of a reference all-solid-state battery to progress, and capacities that are found in advance. The state estimation device 10 uses the relational expression to estimate a capacity of an estimation target all-solid-state battery from a peak frequency computed from an arc chord length in a graph plotting impedances at respective frequencies represented by acquired measurement data of the estimation target all-solid-state battery. Thus, the capacity of the all-solid-state battery may be estimated with consideration for physical deterioration.

Second Exemplary Embodiment

A state estimation device according to a second exemplary embodiment has similar structures to the first exemplary embodiment, and is accordingly described with the same reference symbols being assigned.

—Overall Structure—

The aforementioned FIG. 1 is a block diagram showing hardware structures of the state estimation device 10 according to the second exemplary embodiment.

As shown in the aforementioned FIG. 1, similarly to the first exemplary embodiment, the state estimation device 10 according to the second exemplary embodiment includes the CPU 11, the ROM 12, the RAM 13, the storage 14, the entry unit 15, the display unit 16 and the communications interface 17.

As entries, the entry unit 15 accepts, before and after a test that causes deterioration of a reference all-solid-state battery to progress in accordance with chemical changes, measurement data that is impedances at respective frequencies measured by the impedance method.

More specifically, first an all-solid-state battery structured with a positive electrode layer, a solid-state electrolyte layer and a negative electrode layer is fabricated in the same manner as in the first exemplary embodiment.

The fabricated battery is conditioned by charging and discharging under predetermined conditions. Subsequently, the SoC is adjusted to 50%, and AC impedance measurements are conducted at 25° C.

Then, the battery is charged to SoC 100% at 60° C., and the voltage is held for 48 hours at 100% SoC. Subsequently, the SoC is adjusted to 50% and AC impedance measurements are carried out at 25° C. The same procedure is repeated, and respective AC impedance measurements are carried out for total holding durations of 120 hours and 240 hours.

Thus, measurement data, which is impedances at respective frequencies measured by the impedance method before and after a test that causes deterioration to progress in accordance with chemical changes is prepared for a reference all-solid-state battery. The entry unit 15 receives the measurement data of the reference all-solid-state battery from before and after the test that causes deterioration to progress in accordance with chemical changes.

Hence, the entry unit 15 accepts entries that are measurement data, which is impedances at respective frequencies measured by the impedance method, of an estimation target all-solid-state battery whose capacity is unknown.

More specifically, a charging and discharging test is carried out to charge and discharge the estimation target all-solid-state battery, which is fabricated in a similar manner to the reference all-solid-state battery described above, under predetermined conditions, after which the SoC is adjusted to 50% and AC impedance measurements are conducted at 25° C. to obtain the measurement data.

Now, in a Cole-Cole plot that plots the real components of results obtained by the AC impedance method from an all-solid-state battery on the horizontal axis and the imaginary components on the vertical axis, the arc-shaped curve caused by resistance in charging and discharging reactions of the battery appears. When the all-solid-state battery deteriorates, the chord length y of this arc increases and the peak frequency x (a point at which the absolute values of the imaginary components are at a maximum) decreases. The inventors of the present disclosure have discovered that when deterioration progresses under matching conditions with only duration and a number of cycles changing, the relationship between peak frequencies x and arc chord lengths y that change as the deterioration progresses may be mathematically expressed in the form $y=F(x)$, and have further discovered that a good approximation is provided in the form $y=ax^b$ (in which a and b are constants). To improve the precision of this approximation, a correction term D may be included in the form $y=ax^b+D$ (in which D is the correction term).

Chemical deterioration at a boundary surface between an active material and a solid-state electrolyte, which is the site of a charge transfer reaction, is thought to be a cause of the peak frequency of the arc decreasing in accordance with deterioration. This may be theoretically understood as follows.

Figure 10:
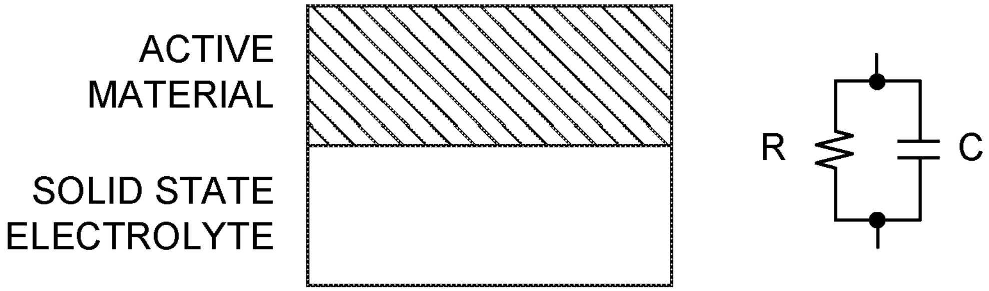
FIG. 10 is a diagram schematically showing a boundary face between an active material and a solid-state electrolyte.

In general, an impedance caused by a charge transfer reaction at a boundary face between an active material and a solid-state electrolyte may be considered as an equivalent circuit constituted by a parallel circuit of a resistance R and a capacitance C that is shown in FIG. 10, which depicts the boundary face schematically. The arc chord length corresponds with the value of R and the peak frequency (which is referred to as the characteristic frequency) corresponds with $1/(2\pi RC)$. The resistance R corresponds with a resistance associated with the charge transfer reaction, and is a portion of resistance of the battery. When chemical deterioration progresses at the boundary face, the resistance R of the boundary surface increases, as a result of which the peak frequency $1/(2\pi RC)$ decreases. The value of C may change in association with changes in the chemical state of the boundary face. However, in practice the peak frequency changes little in association with deterioration. Therefore, the effect of changes in C is thought to be limited.

Meanwhile, the effects of physical deterioration on impedance may be theoretically understood as follows. Specific phenomena of physical deterioration that can be mentioned are that a contact area of the boundary face between the active material and the solid-state electrolyte decreases in association with expansion and contraction of the active material, and that ionic conduction resistance falls in association with the formation of voids in electrode layers and in the solid-state electrolyte.

Figure 11:
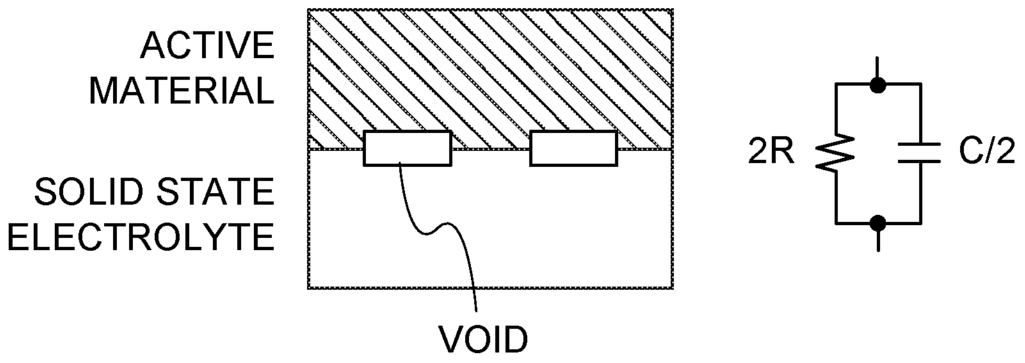
FIG. 11 is a diagram schematically showing a state in which a contact proportion between the active material and the solid-state electrolyte has decreased.

A state in which a contact proportion of the boundary face between the electrolyte and the solid-state electrode has decreased is schematically shown in FIG. 11. When, for example, the contact proportion falls by half, the resistance R of the equivalent circuit doubles, while the capacitance C halves. As a result, the peak frequency $1/(2\pi RC)$ is unchanged but the arc chord length is doubled.

Figure 12:
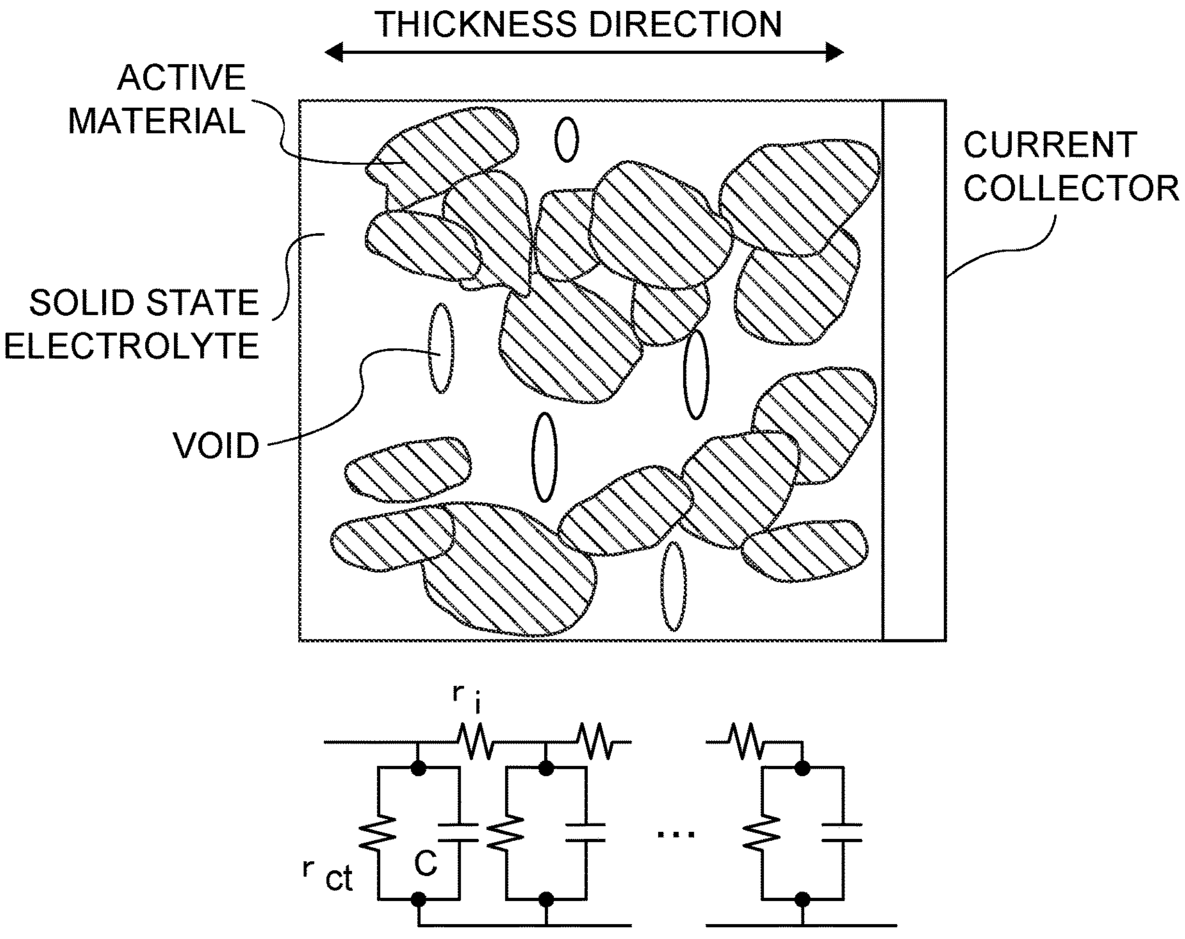
FIG. 12 is a diagram showing an equivalent circuit of impedance at a boundary face between an active material and a solid-state electrolyte.

A conceptual image of a fall in ionic conductance associated with the formation of voids in an electrode and a solid-state electrolyte is shown in FIG. 12. In general, active material particles and solid-state electrolyte particles are mixed and pressed in an electrode layer, producing a state in which the active material is dispersed in the solid-state electrolyte, forming a three-dimensional network. A conductive material such as conductive carbon or the like may also be included in order to improve electron conductivity and a binder may be included in order to improve binding strength. An equivalent circuit of impedance at a boundary face between an electrode and a solid-state electrolyte may be understood as a circuit in which, as shown in FIG. 12, resistances $r_{CT}$ and capacitances c are connected up in a ladder pattern in the thickness direction with lithium ion resistances $r_i$ disposed therebetween. In this situation too, a single arc due to charge transfer resistance appears in a Cole-Cole plot. A value of the chord length of the arc is influenced by the charge transfer resistance and the lithium ion resistance. When voids are formed in the electrolyte due to physical deterioration as illustrated in FIG. 12, the lithium ion resistance $r_i$ can be expected to increase, in which case the arc chord length increases with the increase in the lithium ion resistance $r_i$. For the purpose of calculations, the peak frequency is substantially constant.

Figure 13:
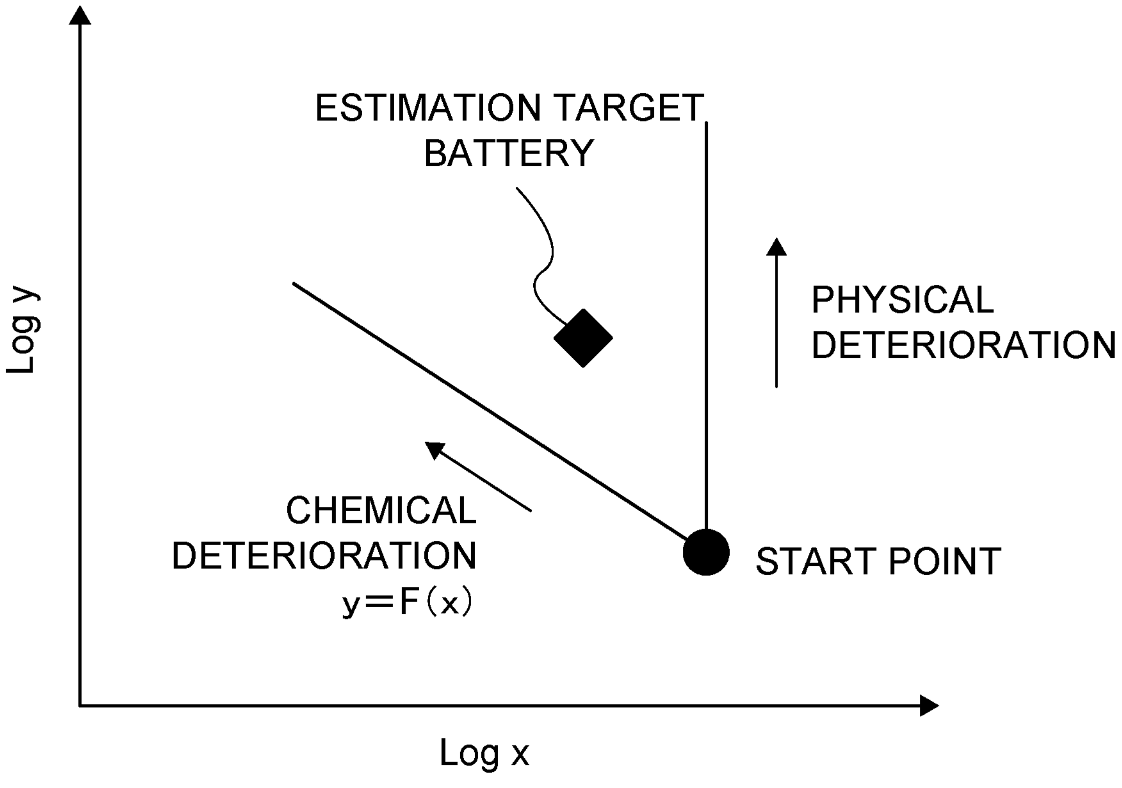
FIG. 13 is a graph showing a relationship between peak frequencies and arc chord lengths.

The relationships between peak frequencies x and arc chord lengths y for chemical deterioration and physical deterioration can be collectively represented by the conceptual diagram in FIG. 13. In deterioration of an all-solid-state battery that is an estimation target, both chemical deterioration and physical deterioration progress simultaneously. Therefore, deterioration can be plotted between the two arrows in FIG. 13. From the descriptions above, a deterioration may be compared with the straight line representing chemical deterioration and an amount of divergence may be quantified. The amount of divergence may be used as an index of physical deterioration.

Figure 14:
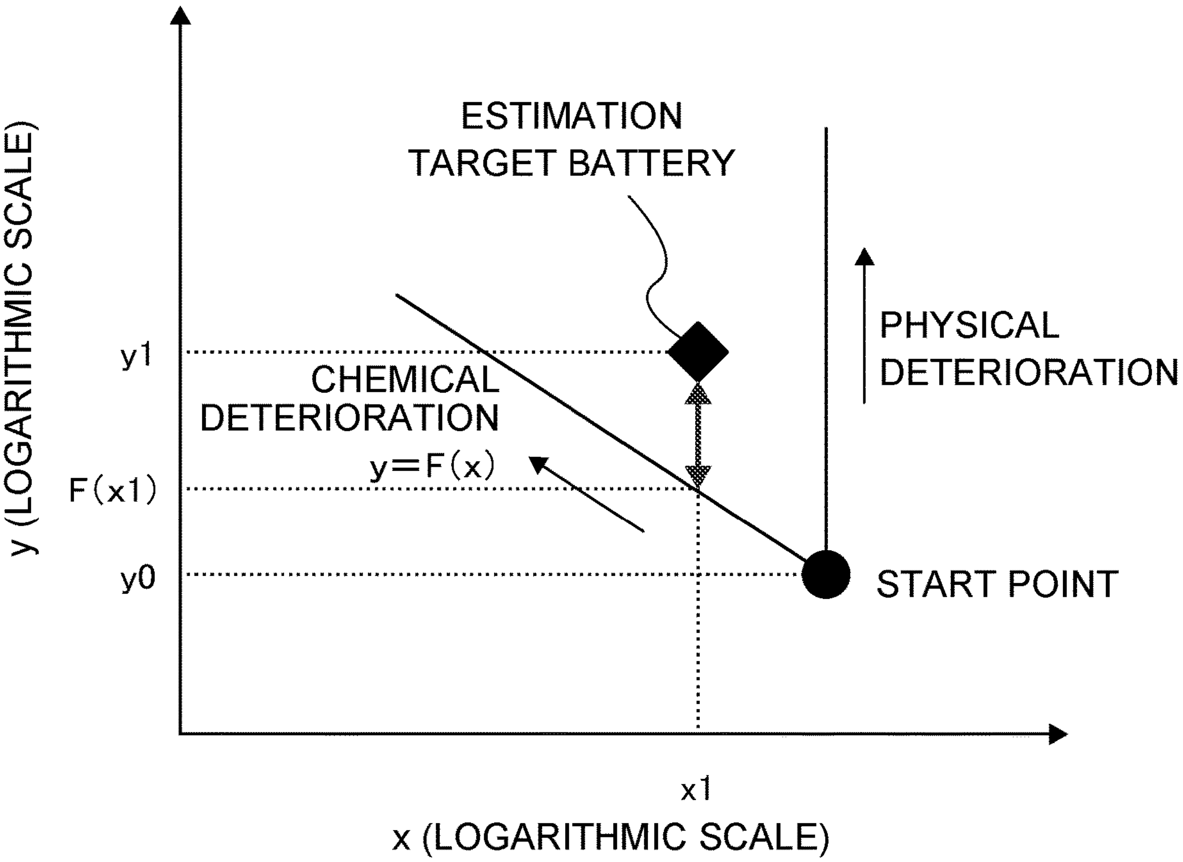
FIG. 14 is a diagram describing a method for estimating a degree of physical deterioration through a comparison with a straight line representing a relationship between peak frequencies and arc chord lengths.

A plot (identified as (x1, y1)) of an all-solid-state battery that is an estimation target is compared with the straight line representing chemical deterioration by comparison of y1 and F(x1) as illustrated in FIG. 14. If the arc chord length at the start point is y0, the difference between F(x1) and y0 may be theoretically understood as the contribution of chemical deterioration, and the difference between y1 and F(x1) as the contribution of physical deterioration. Therefore, a judgment more credibly based in theory may be made. For example, a value y1/F(x1) that is y1 divided by F(x1) may be regarded as an index indicating a ratio of increase in resistance due to the contribution of physical deterioration. It may be possible to repair physical deterioration by putting a separated boundary face back into contact by re-pressing the battery. As a result, it should be possible to reduce a resistance that has risen to y1 down to F(x1).

To perform the comparison described above, it is desirable if a test that causes deterioration to progress in accordance with chemical changes (chemical deterioration) features as little physical deterioration as possible and is close to chemical deterioration alone. That is, the gradient of the straight-line y=F(x) in FIG. 14 being closer to horizontal is desirable. From results of performing this test under various conditions, it can be seen that a method of holding a constant voltage in a charged state exhibits a deterioration mechanism that is closest to chemical deterioration alone. Accordingly, in the present exemplary embodiment, a test that holds a constant voltage in the charged state is utilized as the test that causes deterioration to progress in accordance with chemical changes.

Figure 15:
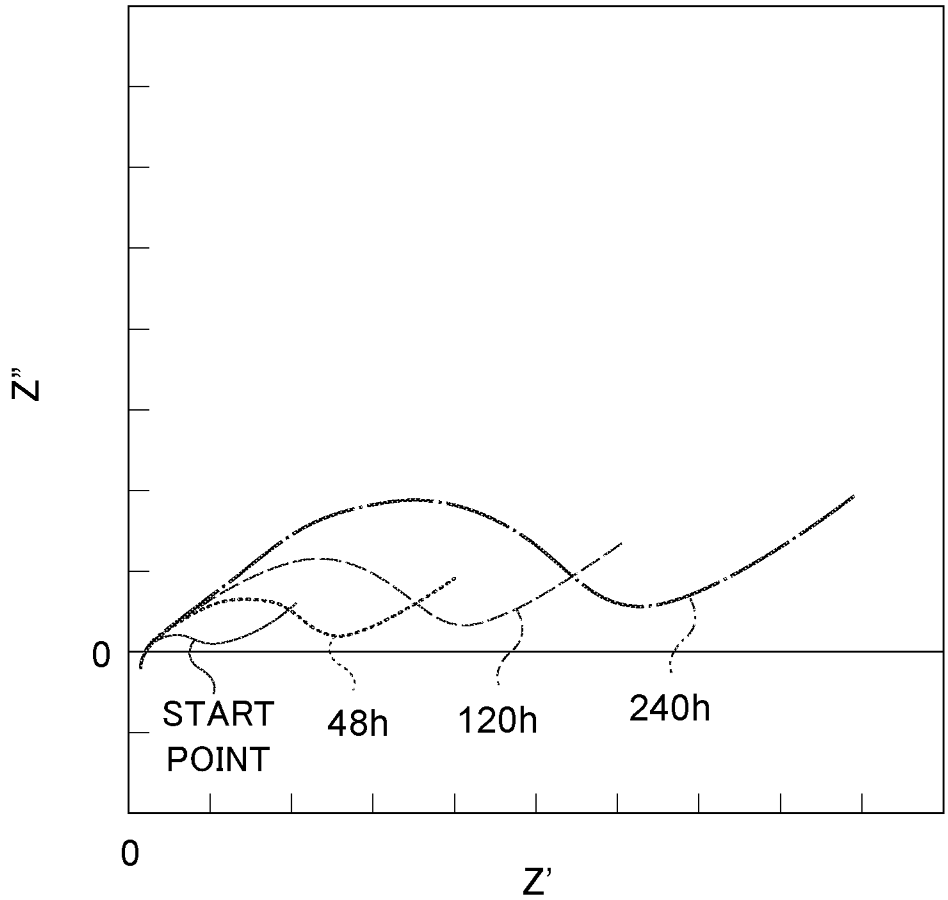
FIG. 15 is a diagram showing an example of a graph plotting impedances at respective frequencies for total holding durations.
Figure 16:
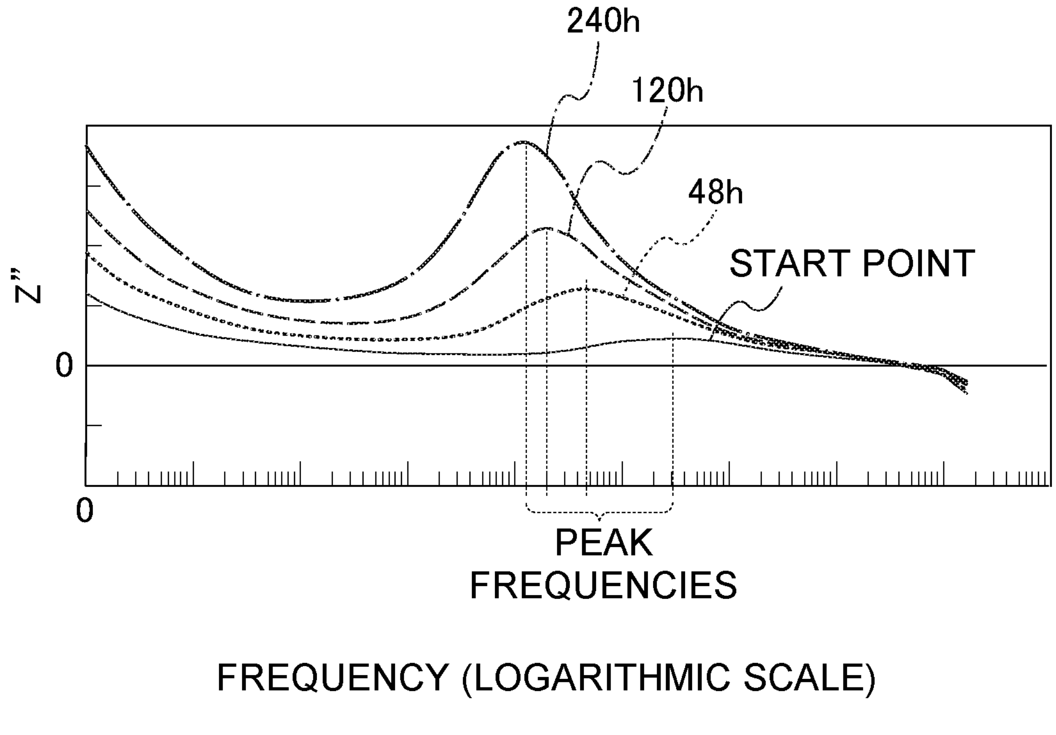
FIG. 16 is a graph showing a relationship between frequencies and imaginary components of impedances.

Cole-Cole plots for respective holding durations in this test are shown in FIG. 15, in which the real components of obtained impedances are plotted on the horizontal axis and the imaginary components are plotted on the vertical axis. Graphs in which frequencies are plotted on the horizontal axis and imaginary components of impedance are plotted on the vertical axis are shown in FIG. 16. From FIG. 15, it can be seen that arc-shaped curves thought to be due to charging and discharging reactions are apparent and that the arcs become larger with the holding duration. From FIG. 16, it can be seen that the peak frequency decreases with increasing holding duration. The charging and discharging reactions that contribute to these arcs are respective reactions at the positive electrode and the negative electrode. It is thought that the reactions at the positive electrode and negative electrode are each constituted by plural elementary reactions and that each arc is the sum of these reactions. In the present disclosure, this may be regarded as approximating a single curve, in which case the extent of physical deterioration at the whole of the positive electrode and negative electrode can be estimated. The arcs may be clearly separated, depending on electrode materials and the like, in which case similar operations may be conducted for the respective arcs and an amount of physical deterioration relating to the elemental reactions may be estimated.

Accordingly, in the state estimation device 10 according to the present exemplary embodiment as illustrated in FIG. 2 described above, by executing the state estimation program 100, the CPU 11 functions as the first acquisition section 150, the derivation section 160, the second acquisition section 170, the computation section 180 and the estimation section 190.

The first acquisition section 150 acquires the measurement data of the reference all-solid-state battery, which is impedances at respective frequencies measured by the impedance method before and after the test that causes deterioration to progress in accordance with chemical changes.

The derivation section 160 computes the peak frequencies and arc chord lengths from the arc-shaped curves in the graphs plotting the impedances at the respective frequencies represented by the measurement data acquired by the first acquisition section 150, and finds the relational expression y=F(x) representing the relationship between peak frequencies x and arc chord lengths y. This relational expression y=F(x) includes the term $ax^b$, in which a and b are constants.

To be specific, similarly to the first exemplary embodiment described above, the terms k, l and m in a relational expression between logarithms of the frequencies f and the imaginary components Z" are found by the least squares method, and the frequency f that produces the greatest value of |Z"| is found to serve as the peak frequency x. A difference between the real components of points at the two ends of each arc that are closest to the real value axis in the above-described FIG. 3 is computed to serve as the arc chord length y.

The arc chord length and peak frequency after the cycling test are computed by the same procedure.

The peak frequencies x found by the method described above and their logarithms and the arc chord lengths y and their logarithms are illustrated in table 3 as relative values, with the values from before the voltage holding being set to 1.

TABLE 3

| Condition | Voltage holding duration (hours) | x (relative value) | log x | y (relative value) | log y |
| --- | --- | --- | --- | --- | --- |
| A | 0 | 1.000 | 0.00 | 1.00 | 0.00 |
| B | 48 | 0.174 | −0.76 | 2.88 | 0.46 |
| C | 120 | 0.081 | −1.09 | 4.73 | 0.68 |
| D | 240 | 0.047 | −1.33 | 7.49 | 0.87 |

Figure 17:
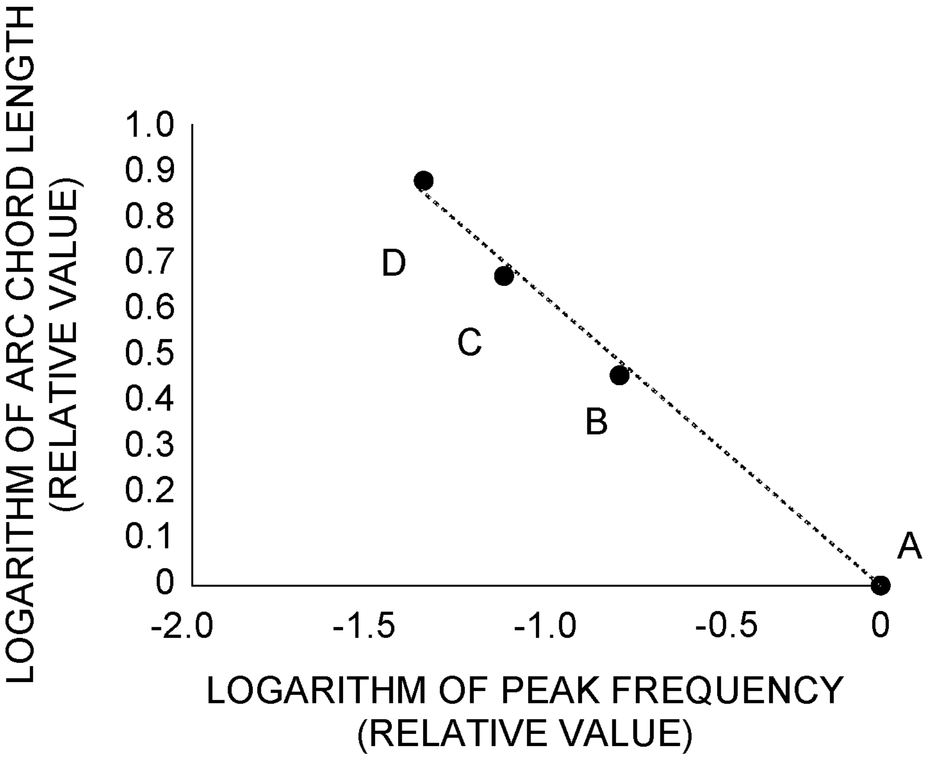
FIG. 17 is a graph showing a relationship between peak frequencies and arc chord lengths.

The values of log x and log y have a linear relationship (FIG. 17), and a relational expression is obtained by the least squares method.

$$\log y = b \cdot \log x + c$$

This expression is rearranged to obtain relational expression 2.

$$y = ax^b \quad \text{(relational expression 2)}$$

The second acquisition section 170 acquires measurement data of an estimation target rechargeable battery, which is impedances at respective frequencies measured by the impedance method.

The computation section 180 computes a peak frequency and arc chord length from an arc-shaped curve in a graph plotting the impedances at the respective frequencies represented by the measurement data acquired by the second acquisition section 170.

From the peak frequency and arc chord length of the estimation target rechargeable battery, the estimation section 190 uses relational expression 2 to estimate a degree of physical deterioration of the estimation target rechargeable battery. The estimated degree of physical deterioration is displayed through the display unit 16.

To be specific, the degree of physical deterioration of the estimation target rechargeable battery is estimated on the basis of a comparison between the arc chord length y1 of the estimation target rechargeable battery and an arc chord length y2 that is obtained by substituting the peak frequency x1 of the estimation target rechargeable battery into the relational expression y=F(x).

Even more specifically, a value y1/y2 in which y1 is divided by y2 is computed to serve as the degree of physical deterioration. Then, if y1/y2 is at least a pre-specified judgment reference value, re-pressing is judged to be necessary. If y1/y2 is less than the judgment reference value, re-pressing is judged to not be necessary. The result of this judgment is displayed at the display unit 16.

Operation of the State Estimation Device According to the Second Exemplary Embodiment Now, operation of the state estimation device 10 according to the second exemplary embodiment is described.

Figure 18:
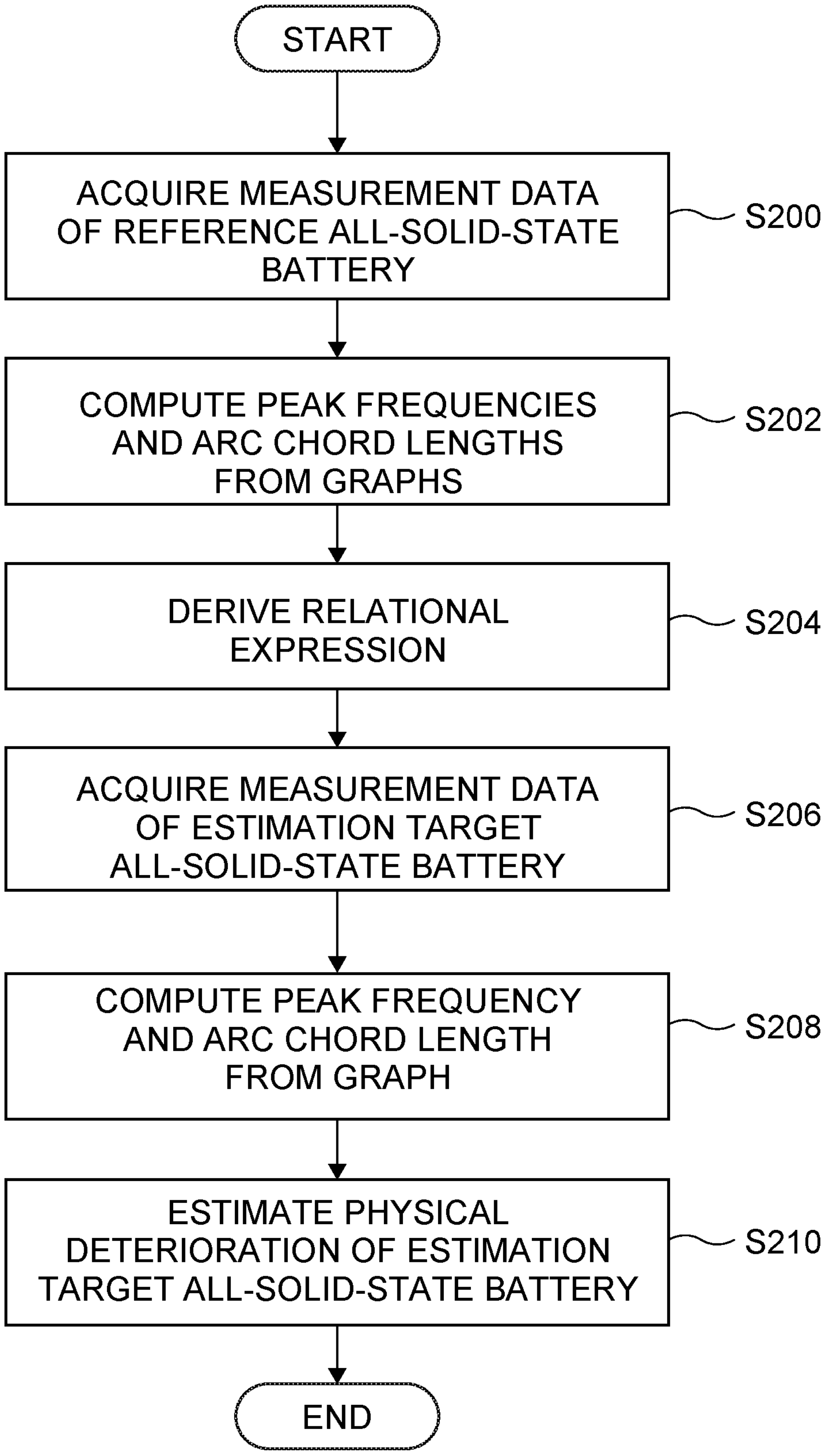
FIG. 18 is a flowchart showing a flow of state estimation processing that is executed at a state estimation device according to a second exemplary embodiment.

FIG. 18 is a flowchart showing a flow of state estimation processing by the state estimation device 10. The CPU 11 implements the state estimation processing by reading the state estimation program 100 from the storage 14, loading the state estimation program 100 to the RAM 13 and executing the state estimation program 100. Measurement data of the reference all-solid-state battery that is impedances at respective frequencies measured by the impedance method before and after the test is entered into the state estimation device 10 and stored at the storage 14.

The measurement data of the estimation target all-solid-state battery that is impedances at respective frequencies measured by the impedance method is also entered into the state estimation device 10 and stored at the storage 14.

In step S200, the CPU 11 serves as the first acquisition section 150 and acquires the measurement data of the reference all-solid-state battery that is impedances at respective frequencies measured by the impedance method before and after the test that causes deterioration to progress in accordance with chemical changes.

In step S202, the CPU 11 serves as the derivation section 160 and, in graphs plotting the impedances at respective frequencies represented by the measurement data acquired in step S200, computes peak frequencies and arc chord lengths from arc-shaped curves.

In step S204, the CPU 11 serves as the derivation section 160 and obtains the relational expression y=F(x) representing the relationship between peak frequencies x and arc chord lengths y.

In step S206, the CPU 11 serves as the second acquisition section 170 and acquires the measurement data of the estimation target all-solid-state battery that is impedances at respective frequencies measured by the impedance method.

In step S208, the CPU 11 serves as the computation section 180 and, in a graph plotting the impedances at respective frequencies represented by the measurement data acquired in step S206, computes a peak frequency and arc chord length from an arc-shaped curve.

In step S210, the CPU 11 serves as the estimation section 190, uses relational expression 2 to estimate a degree of physical change of the estimation target all-solid-state battery from the peak frequency and arc chord length of the estimation target all-solid-state battery, displays the estimated degree of physical change with the display unit 16, and ends the state estimation processing.

Example 2

An Example in which the state estimation device 10 according to the second exemplary embodiment described above is used to estimate a capacity is described.

Cells with the same specifications as a reference all-solid-state battery were used as estimation target all-solid-state batteries and the cycling test was performed under various conditions simulating usage with repeated charging and discharging. Arc chord lengths y1 and peak frequencies x1 of the cells after the cycling test were found.

The cycling test conditions, arc chord lengths y1 and peak frequencies x1 are shown in table 4. These values are shown on a graph in FIG. 19. The same as in table 3, the values of x1 and y1 are shown as relative values, with values before the voltage holding being set to 1.

TABLE 4

| | Cycling test conditions | | | Peak frequency x1 (relative | log | Arc chord length y1 (relative | log |
| --- | --- | --- | --- | --- | --- | --- | --- |
| Condition | Temperature | Voltage | Cycles | value) | x1 | value) | y1 |
| E | 60 | 3-4.35 V | 100 | 0.206 | −0.69 | 3.46 | 0.54 |
| F | | | 200 | 0.102 | −0.99 | 5.65 | 0.75 |
| G | | | 300 | 0..74 | −1.13 | 7.56 | 0.88 |
| H | 60 | 3-4.2 V | 100 | 0.705 | −0.15 | 1.72 | 0.23 |
| I | | | 200 | 0.438 | −0.36 | 2.46 | 0.39 |
| J | | | 300 | 0.346 | −0.46 | 2.94 | 0.47 |

TABLE 4-continued

| Condition | Cycling test conditions: Temperature | Voltage | Cycles | Peak frequency x1 (relative value) | log x1 | Arc chord length y1 (relative value) | log y1 |
|---|---|---|---|---|---|---|---|
| K | 25 | 3-4.35 V | 100 | 0.758 | −0.12 | 1.31 | 0.12 |
| L | | | 200 | 0.656 | −0.18 | 1.49 | 0.17 |
| M | | | 300 | 0.601 | −0.22 | 1.61 | 0.21 |

Figure 19:
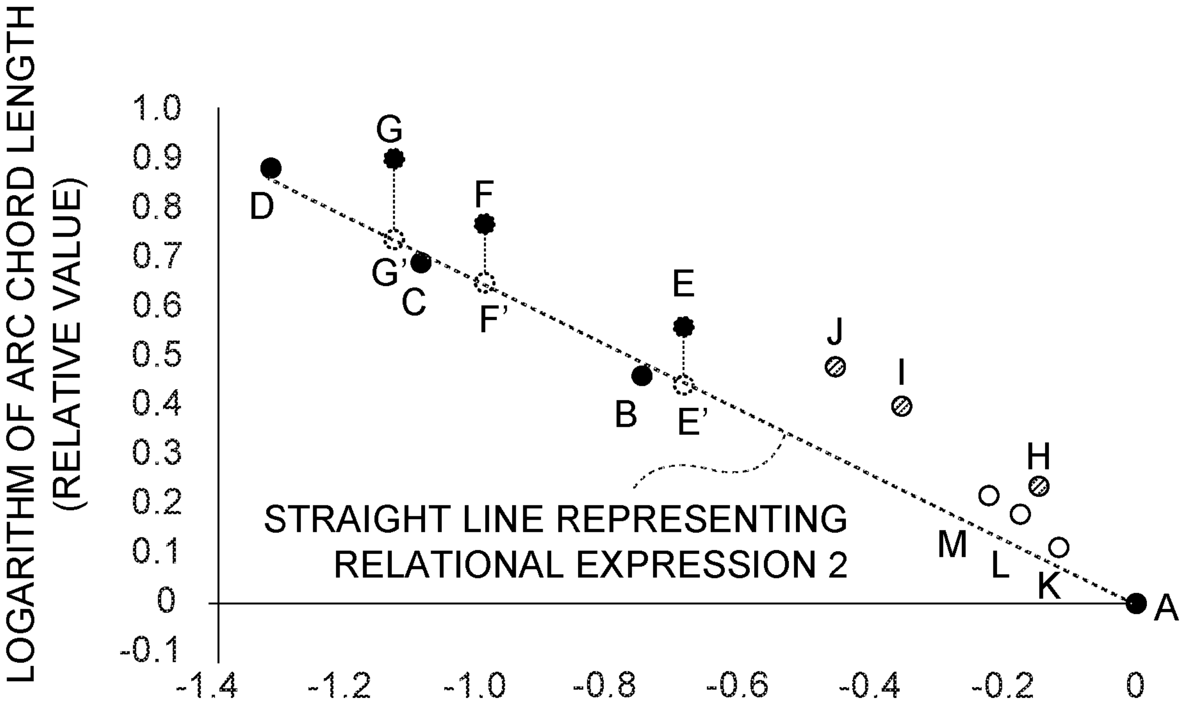
FIG. 19 is a graph showing a relationship between peak frequencies and arc chord lengths in Example 2.

In FIG. 19, all points from after the cycling test are plotted higher than the straight line of relational expression 2. Therefore, it can be seen that the test that accelerated deterioration by holding a constant voltage in the charged state, which was conducted in order to obtain relational expression 2, was close to chemical deterioration alone without featuring physical deterioration, as intended.

Arc chord lengths y2 (y2=F(x1)) that are due to chemical changes were computed by substituting the peak frequencies x1 under the respective conditions obtained as described above into relational expression 2 (table 5). This is equivalent to computing arc chord lengths at the points E', F' and G' in FIG. 19. Then, each value y1 was divided by y2 to compute y1/y2 (table 5). Each value y1/y2 is a numerical value representing a proportional increase of the resistance component due to physical deterioration. The larger this numerical value, the greater the contribution of physical deterioration.

TABLE 5

| Condition | Cycling test conditions: Temperature | Voltage | Cycles | y2 (relative value) | y1/y2 | With judgment reference 1.2, re-pressing needed? |
|---|---|---|---|---|---|---|
| E | 60 | 3-4.35 V | 100 | 2.71 | 1.28 | Yes |
| F | | | 200 | 4.27 | 1.32 | Yes |
| G | | | 300 | 5.26 | 1.44 | Yes |
| H | 60 | 3-4.2 V | 100 | 1.22 | 1.41 | Yes |
| I | | | 200 | 1.66 | 1.48 | Yes |
| J | | | 300 | 1.93 | 1.52 | Yes |
| K | 25 | 3-4.35 V | 100 | 1.16 | 1.12 | No |
| L | | | 200 | 1.28 | 1.16 | No |
| M | | | 300 | 1.35 | 1.19 | No |

When y1/y2 is greater, the contribution of physical deterioration is greater, which means that a restoration of performance by re-pressing can be expected. For example, cells requiring re-pressing may be identified (table 5) by setting the judgment reference value to 1.2.

Overview of the Exemplary Embodiment

The state estimation device 10 according to the present exemplary embodiment finds a relational expression representing a relationship between peak frequencies and arc chord lengths on the basis of peak frequencies and arc chord lengths computed before and after the test that causes deterioration of a reference all-solid-state battery to progress, and the state estimation device 10 uses the relational expression to estimate a state of an estimation target all-solid-state battery from an arc chord length and a peak frequency computed from an arc chord length in a graph plotting impedances at respective frequencies represented by acquired measurement data of the estimation target all-solid-state battery. Thus, physical deterioration may be considered and a degree of physical deterioration of the all-solid-state battery may be estimated.

REMARKS

In the exemplary embodiments described above, examples are described in which capacities and degrees of physical deterioration of all-solid-state batteries are estimated, but this is not limiting. As long as a rechargeable battery uses a solid-state electrolyte, the battery need not be an all-solid-state battery. For example, capacities and degrees of physical deterioration of semi-solid-state batteries may be estimated.

In the first exemplary embodiment described above, an example is described in which a relational expression representing a relationship between peak frequencies and capacities is obtained and the relational expression is used to estimate a capacity of an estimation target all-solid-state battery, but this is not limiting. For example, a trained model which is a neural network or the like that inputs a peak frequency and outputs a capacity may be obtained, and the trained model may be used to estimate a capacity of an estimation target all-solid-state battery.

In the second exemplary embodiment described above, an example is described in which a relational expression representing a relationship between peak frequencies and arc chord lengths is obtained and the relational expression is used to estimate a degree of physical deterioration of an estimation target all-solid-state battery, but this is not limiting. For example, a trained model which is a neural network or the like that inputs a peak frequency and outputs an arc chord length may be obtained, and the trained model may be used to estimate a degree of physical deterioration of an estimation target all-solid-state battery.

In the exemplary embodiment described above, the CPU 11 reads and executes software (a program) but various processes may be executed by various kinds of processor other than a CPU. Examples of processors in these cases include a PLD (programmable logic device) in which a circuit configuration can be modified after manufacturing, such as an FPGA (field programmable gate array) or the like, a dedicated electronic circuit which is a processor with a circuit configuration that is specially designed to execute specific processing, such as an ASIC (application-specific integrated circuit) or the like, and so forth. The processing described above may be executed by one of these various kinds of processors, and may be executed by a combination of two or more processors of the same or different kinds (for example, plural FPGAs, a combination of a CPU with an FPGA, or the like). Hardware structures of these various kinds of processors are, to be more specific, electronic circuits combining circuit components such as semiconductor components and the like.

In the exemplary embodiment described above, modes are described in which a program is memorized in advance (installed) on a computer readable non-transitory recording medium. For example, the state estimation program 100 of the state estimation device 10 is memorized in advance at the storage 14. However, this is not limiting and a program may be provided in a mode of being recorded on a non-transitory recording medium such as a CD-ROM (compact disc read-only memory), DVD-ROM (digital versatile disc read-only memory), USB (universal serial bus) memory or the like. Modes are also possible in which a program is downloaded from external equipment via a network.

The flows of processing described in the above exemplary embodiments are examples. Unnecessary steps may be removed, new steps may be added, and processing sequences may be rearranged within a scope not departing from the gist of the disclosure.

What is claimed is:

1. A state estimation method for estimating a state of a rechargeable battery that uses a solid-state electrolyte, the state estimation method comprising a computer:

executing, for a reference rechargeable battery, a charging-and-discharging test that causes deterioration to progress, wherein the test electrically charges and discharges the reference rechargeable battery;

acquiring measurement data and states of the reference rechargeable battery before and after the test that causes deterioration to progress, the measurement data being impedances at respective frequencies that are measured by an impedance method, and the states being found in advance;

computing peak frequencies before and after the test from arc-shaped curves in graphs plotting the impedances at the respective frequencies represented by the measurement data;

based on the computed peak frequencies before and after the test and the states found in advance, obtaining a model that represents a relationship between the peak frequencies and the states;

acquiring measurement data of an estimation target rechargeable battery, the measurement data being impedances at respective frequencies that are measured by the impedance method;

computing a peak frequency from an arc-shaped curve in a graph plotting the impedances at the respective frequencies represented by the measurement data; and estimating a state of the estimation target rechargeable battery from the peak frequency of the estimation target rechargeable battery, the estimating including using the model.

2. The state estimation method according to claim 1, wherein the states are capacities.

3. The state estimation method according to claim 2, wherein the model is a relational expression w=F (x) representing a relationship between peak frequencies x and capacities w.

4. The state estimation method according to claim 3, wherein the relational expression w=F (x) includes a term a·log x and a term b, a and b being constants.

5. A state estimation method for estimating a state of a rechargeable battery that uses a solid-state electrolyte, the state estimation method comprising a computer:

executing, for a reference rechargeable battery, a charging-and-discharging test that causes deterioration to progress, wherein the test electrically charges and discharges the reference rechargeable battery;

acquiring measurement data of the reference rechargeable battery before and after the test that causes deterioration to progress, the measurement data being impedances at respective frequencies that are measured by an impedance method;

computing peak frequencies and arc chord lengths before and after the test from arc-shaped curves in graphs plotting the impedances at the respective frequencies represented by the measurement data;

based on the computed peak frequencies and the arc chord lengths before and after the test, obtaining a model that represents a relationship between the peak frequencies and the arc chord lengths;

acquiring measurement data of an estimation target rechargeable battery, the measurement data being impedances at respective frequencies that are measured by the impedance method;

computing a peak frequency and an arc chord length from an arc-shaped curve in a graph plotting the impedances at the respective frequencies represented by the measurement data; and estimating a state of the estimation target rechargeable battery from the peak frequency and an arc chord length of the estimation target rechargeable battery, the estimating including using the model.

6. The state estimation method according to claim 5, wherein:

the test is a test that causes deterioration in accordance with chemical change to progress, the state is a degree of physical deterioration, the model is a relational expression y=F (x) representing a relationship between peak frequencies x and arc chord lengths y, and the degree of physical deterioration of the estimation target rechargeable battery is estimated based on a comparison between the peak frequency and the arc chord length of the estimation target rechargeable battery and the relational expression y=F (x).

7. The state estimation method according to claim 6, wherein estimating the degree of physical deterioration of the estimation target rechargeable battery includes estimating the degree of physical deterioration based on a comparison between:

an arc chord length y1 of the estimation target rechargeable battery and an arc chord length y2 that is obtained by substituting a peak frequency x1 of the estimation target rechargeable battery into the relational expression y=F (x).

8. The state estimation method according to claim 6, wherein the relational expression y=F (x) includes a term $ax^b$, a and b being constants.

9. The state estimation method according to claim 6, wherein the test that causes deterioration in accordance with chemical change to progress is a test that holds a constant voltage in a charged state.

10. A state estimation device that estimates a state of a rechargeable battery that uses a solid-state electrolyte, the state estimation device comprising a memory and a processor coupled to the memory, the processor being configured to:

execute, for a reference rechargeable battery, a charging-and-discharging test that causes deterioration to progress, wherein the test electrically charges and discharges the reference rechargeable battery;

acquire measurement data and states of the reference rechargeable battery before and after the test that causes deterioration to progress, the measurement data being impedances at respective frequencies that are measured by an impedance method, and the states being found in advance;

compute peak frequencies before and after the test from arc-shaped curves in graphs plotting the impedances at the respective frequencies represented by the measurement data and, based on the computed peak frequencies before and after the test and the states found in advance, obtain a model that represents a relationship between the peak frequencies and the states;

acquire measurement data of an estimation target rechargeable battery, the measurement data being impedances at respective frequencies that are measured by the impedance method;

compute a peak frequency from an arc-shaped curve in a graph plotting the impedances at the respective frequencies represented by the measurement data; and use the model to estimate a state of the estimation target rechargeable battery from the peak frequency of the estimation target rechargeable battery.

11. A state estimation device that estimates a state of a rechargeable battery that uses a solid-state electrolyte, the state estimation device comprising a memory and a processor coupled to the memory, the processor being configured to:

execute, for a reference rechargeable battery, a charging-and-discharging test that causes deterioration to progress, wherein the test electrically charges and discharges the reference rechargeable battery;

acquire measurement data of the reference rechargeable battery before and after the test that causes deterioration to progress, the measurement data being impedances at respective frequencies that are measured by an impedance method;

compute peak frequencies and arc chord lengths before and after the test from arc-shaped curves in graphs plotting the impedances at the respective frequencies represented by the measurement data;

based on the computed peak frequencies and the arc chord lengths before and after the test, obtain a model that represents a relationship between the peak frequencies and the arc chord lengths;

acquire measurement data of an estimation target rechargeable battery, the measurement data being impedances at respective frequencies that are measured by the impedance method;

compute a peak frequency and an arc chord length from an arc-shaped curve in a graph plotting the impedances at the respective frequencies represented by the measurement data; and use the model to estimate a state of the estimation target rechargeable battery from the peak frequency and an arc chord length of the estimation target rechargeable battery.

12. A non-transitory storage medium storing a program for estimating a state of a rechargeable battery that uses a solid-state electrolyte, the program being executable by a computer to perform processing, the processing comprising:

executing, for a reference rechargeable battery, a charging-and-discharging test that causes deterioration to progress, wherein the test electrically charges and discharges the reference rechargeable battery;

acquiring measurement data and states of the reference rechargeable battery before and after the test that causes deterioration to progress, the measurement data being impedances at respective frequencies that are measured by an impedance method, and the states being found in advance;

computing peak frequencies before and after the test from arc-shaped curves in graphs plotting the impedances at the respective frequencies represented by the measurement data;

based on the computed peak frequencies before and after the test and the states found in advance, obtaining a model that represents a relationship between the peak frequencies and the states;

acquiring measurement data of an estimation target rechargeable battery, the measurement data being impedances at respective frequencies that are measured by the impedance method;

computing a peak frequency from an arc-shaped curve in a graph plotting the impedances at the respective frequencies represented by the measurement data; and frequency of the estimation target rechargeable battery, the estimating including using the model.

13. A non-transitory storage medium storing a program for estimating a state of a rechargeable battery that uses a solid-state electrolyte, the program being executable by a computer to perform processing, the processing comprising:

executing, for a reference rechargeable battery, a charging-and-discharging test that causes deterioration to progress, wherein the test electrically charges and discharges the reference rechargeable battery;

acquiring measurement data of the reference rechargeable battery before and after the test that causes deterioration to progress, the measurement data being impedances at respective frequencies that are measured by an impedance method;

computing peak frequencies and arc chord lengths before and after the test from arc-shaped curves in graphs plotting the impedances at the respective frequencies represented by the measurement data;

based on the computed peak frequencies and the arc chord lengths before and after the test, obtaining a model that represents a relationship between the peak frequencies and the arc chord lengths;

acquiring measurement data of an estimation target rechargeable battery, the measurement data being impedances at respective frequencies that are measured by the impedance method;

computing a peak frequency and an arc chord length from an arc-shaped curve in a graph plotting the impedances at the respective frequencies represented by the measurement data; and estimating a state of the estimation target rechargeable battery from the peak frequency and an arc chord length of the estimation target rechargeable battery, the estimating including using the model.

* * * * *